US011029740B2

(12) United States Patent
Kaeriyama et al.

(10) Patent No.: US 11,029,740 B2
(45) Date of Patent: Jun. 8, 2021

(54) POWER CONVERSION DEVICE AND SEMICONDUCTOR DEVICE

(71) Applicant: RENESAS ELECTRONICS CORPORATION, Tokyo (JP)

(72) Inventors: Shunichi Kaeriyama, Tokyo (JP); Norio Kido, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 232 days.

(21) Appl. No.: 16/189,089

(22) Filed: Nov. 13, 2018

(65) Prior Publication Data

US 2019/0204889 A1 Jul. 4, 2019

(30) Foreign Application Priority Data

Dec. 28, 2017 (JP) .............................. JP2017-254366

(51) Int. Cl.
*G06F 1/28* (2006.01)
*H02P 29/68* (2016.01)
(Continued)

(52) U.S. Cl.
CPC .................. *G06F 1/28* (2013.01); *G01K 1/08* (2013.01); *G01K 7/01* (2013.01); *H02M 1/32* (2013.01);
(Continued)

(58) Field of Classification Search
CPC .. G06F 1/28; H02P 29/68; G01K 1/08; G01K 7/01; H02M 1/32; H02M 2001/327; H03K 17/082; H03K 2017/0806
See application file for complete search history.

(56) References Cited

U.S. PATENT DOCUMENTS 4,954,917 A 9/1990 Wirth
5,500,616 A 3/1996 Ochi
(Continued)

FOREIGN PATENT DOCUMENTS

DE 10 2016 206590 A1 10/2017
EP 2 568 268 A1 3/2013
(Continued)

OTHER PUBLICATIONS

Extended European Search Report issued in corresponding European Patent Application No. 18215912.9-1203, dated Aug. 9, 2019.
(Continued)

*Primary Examiner* — Fred E Finch, III
*Assistant Examiner* — Kevin H Sprenger
(74) *Attorney, Agent, or Firm* — McDermott Will & Emery LLP

(57) ABSTRACT

There is to provide a power conversion device capable of estimating a junction temperature of a power transistor at a high accuracy. The control device includes a temperature estimation unit and controls the on and off of the power transistor through a driver. The voltage detection circuit detects the inter-terminal voltage of a source and drain terminals during the on-period of the power transistor. The temperature estimation unit previously holds the correlation information between the inter-terminal voltage and inter-terminal current of the source and drain terminals and the junction temperature, and estimates the junction temperature, based on the inter-terminal voltage detected by the voltage detection circuit, the known inter-terminal current, and the correlation information.

16 Claims, 20 Drawing Sheets

(51) Int. Cl.
*G01K 1/08* (2021.01)
*H02M 1/32* (2007.01)
*H03K 17/082* (2006.01)
*G01K 7/01* (2006.01)
*H03K 17/08* (2006.01)

(52) U.S. Cl.
CPC ........... *H02P 29/68* (2016.02); *H03K 17/082* (2013.01); *H02M 2001/327* (2013.01); *H03K 2017/0806* (2013.01)

(56) References Cited

U.S. PATENT DOCUMENTS

| | | | |
|---|---|---|---|
| 2007/0097718 A1* | 5/2007 | Nahar | H02M 1/32 363/65 |
| 2012/0032660 A1 | 2/2012 | Nakamura | |
| 2014/0212289 A1 | 7/2014 | Thogersen et al. | |
| 2014/0225659 A1* | 8/2014 | Bhangu | H03K 17/145 327/378 |
| 2015/0211938 A1 | 7/2015 | Imakiire et al. | |
| 2016/0036430 A1* | 2/2016 | Rannestad | H02M 7/44 363/132 |
| 2017/0350934 A1* | 12/2017 | Sathik | G01R 31/2617 |
| 2017/0365222 A1* | 12/2017 | Carpenter | G09G 3/342 |
| 2018/0003572 A1* | 1/2018 | Garsd | G01K 3/14 |
| 2018/0198442 A1 | 7/2018 | Hokazono et al. | |
| 2020/0112245 A1 | 4/2020 | Mitsui et al. | |

FOREIGN PATENT DOCUMENTS

| | | |
|---|---|---|
| JP | 2012-039761 A | 2/2012 |
| JP | 2012-207976 A | 10/2012 |
| WO | 2014/091852 A1 | 6/2014 |
| WO | 2017/104077 A1 | 6/2017 |
| WO | 2017/168951 A1 | 10/2017 |

OTHER PUBLICATIONS

N. Iwamuro, et al.,"A new vertical IGBT structure with a monolithic over-current, over-voltage, and over-temperature sensing and protecting circuit", IEEE Electron Device Letters,vol. 16,No. 9, Sep. 1995.

D. Domes, et al.,"IGBT-Module Integrated Current and Temperature Sense Features based on Sigma-Delta Converter", PCIM Europe, 2009.

T. P. Chow, et al.,"Design of Current Sensors in IGBT's", 50th Annual Device Research Conference, 1992.

Japanese Notice of Reasons for Refusal issued in corresponding Japanese Patent Application No. 2017-254366, dated Feb. 25, 2021, with English translation.

* cited by examiner

FIG. 10A
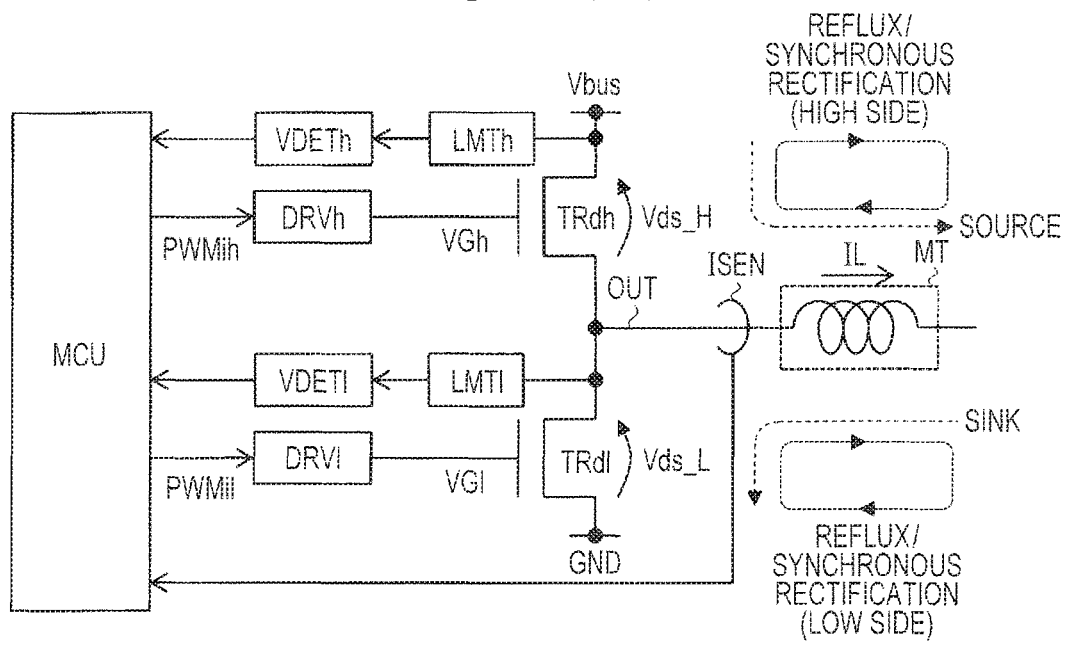
FIG. 10B
| STATE | IL | VGh | VGl | Vds_H | Vds_L | OPERATION STATE |
|---|---|---|---|---|---|---|
| ST1 | → | H | L | Vds(IL, T) | ≒Vbus | SOURCE (HIGH SIDE) |
| ST2 | → | L | L | ≒Vbus | -Vf(IL, T) | REFLUX RECTIFICATION (LOW SIDE) |
| ST3 | → | L | H | ≒Vbus | -Vds(IL, T) | SYNCHRONOUS RECTIFICATION (LOW SIDE) |
| ST4 | ← | L | H | ≒Vbus | Vds(IL, T) | SINK (LOW SIDE) |
| ST5 | ← | L | L | -Vf(IL, T) | ≒Vbus | REFLUX RECTIFICATION (HIGH SIDE) |
| ST6 | ← | H | L | -Vds(IL, T) | ≒Vbus | SYNCHRONOUS RECTIFICATION (HIGH SIDE) |
FIG. 10C
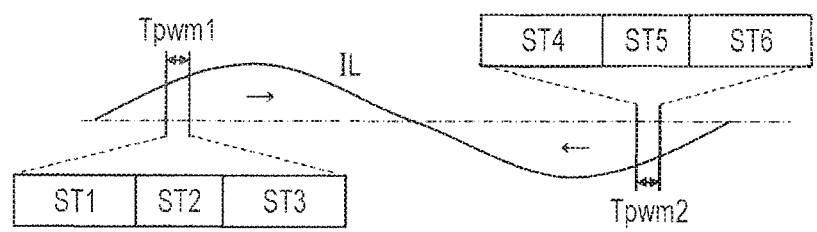

POWER CONVERSION DEVICE AND SEMICONDUCTOR DEVICE

CROSS-REFERENCE TO RELATED APPLICATIONS

The disclosure of Japanese Patent Application No. 2017-254366 filed on Dec. 28, 2017 including the specification, drawings and abstract is incorporated herein by reference in its entirety.

BACKGROUND

The invention relates to a power conversion device and a semiconductor device and, for example, to a protection technique in an inverter and a switching power source.

Non-patent literature "A new vertical IGBT structure with a monolithic over-current, over-voltage, and over-temperature sensing and protecting circuit" written by N. Iwamuro, et al, IEEE Electron Device Letters, Vol. 16, No. 9, September 1995 describes a method of integrating a temperature detecting diode on a chip of a power transistor and applying a constant current there to read a forward direction voltage, in order to detect a junction temperature. International Patent Publication No. 2014-091852 describes a method of mounting a temperature sensor such as a thermister in a module with a power transistor mounted there and estimating a junction temperature of the power transistor through calculation. According to this method, a loss is calculated from the current and voltage of the power transistor, a temperature rise amount of the thermister is estimated according to the loss, and the temperature rise amount is subtracted from the temperature detected value of the thermister, hence to estimate a cooling element temperature. The junction temperature of the power transistor is estimated with the estimated value of the cooling element temperature as a basic temperature.

U.S. Pat. No. 4,954,917 discloses a method of detecting a short circuit and over-current in a power transistor, based on a collector voltage or a drain voltage in the power transistor. Japanese Unexamined Patent Application Publication No. 2012-207976 describes a method of detecting over-current of a power transistor at a high accuracy. Specifically, the over-current detection accuracy is reduced according to the temperature characteristics of the on-resistance in the power transistor; therefore, a thermister for correcting an error about the temperature characteristics is provided. A structure of having a current detecting transistor coupled to a power transistor and adding an emitter terminal or a source terminal according to the above is disclosed in "IGBT-Module integrated Current and Temperature Sense Features based on Sigma-Delta Converter" written by D. Domes, U. Schwarzer, PCIM Europe, 2009 and "Design of Current Sensors in IGBT's" written by T. P. Chow, et al, 50th Annual Device Research Conference, 1992.

SUMMARY

For example, in a power transistor used in an inverter and the like, generally a temperature detecting circuit for detecting a temperature according to the generation of heat is provided. Using the temperature detecting circuit, for example, when a junction temperature of the power transistor arrives at a predetermined temperature according to the over-current, the power transistor and a system including the same power transistor can be protected by performing a turn-off operation. In this case, temperature detection at a higher accuracy is desired. According as the temperature detection gets more accurate, a demanded margin in the thermal design of the power transistor can be reduced, hence to also reduce the cost.

As a temperature detecting method, there are a method of integrating a temperature detecting diode on a chip, like "A new vertical IGBT structure with a monolithic over-current, over-voltage, and over-temperature sensing and protecting circuit" written by N. Iwamuro, et al, IEEE Electron Device Letters, Vol. 16, No. 9, September 1995, and a method of providing a thermister outside a chip, like International Patent Publication No. 2014-091852. In the former method, a temperature detecting diode is manufactured, for example, using polycrystalline silicon, and the manufacturing variation is large, which disturbs getting a good estimated accuracy of a junction temperature. In the latter method, there is a distance between the thermister and the power transistor, which also disturbs getting a good estimation accuracy of the junction temperature.

The embodiments described later are made taking the above into consideration, and other objects and novel characteristics will be apparent from the description of the specification and the attached drawings.

A power conversion device according to one embodiment includes a power transistor, a driver, a control device, and a voltage detection circuit. The power transistor includes a control input terminal, a first terminal, and a second terminal, and supplies electric power to a predetermined load through the first and the second terminals. The driver drives the control input terminal. The control device includes a temperature estimation unit and controls the one and off of the power transistor through the driver. The voltage detection circuit detects the inter-terminal voltage of the first and the second terminals during the on-period of the power transistor. The temperature estimation unit previously holds the correlation information between the inter-terminal voltage and inter-terminal current of the first and the second terminals and the junction temperature and estimates the junction temperature, based on the inter-terminal voltage obtained from the voltage detection circuit, the known inter-terminal current, and the correlation information.

According to one embodiment, it is possible to estimate the junction temperature of a power transistor at a high precision.

BRIEF DESCRIPTION OF THE DRAWINGS

FIG. 10A is a schematic view showing a structural example of the main portion of a motor system with a power conversion device according to a second embodiment of the invention applied, and FIGS. 10B and 10C are views showing the operation example of FIG. 10A.

DETAILED DESCRIPTION

Figure 1:
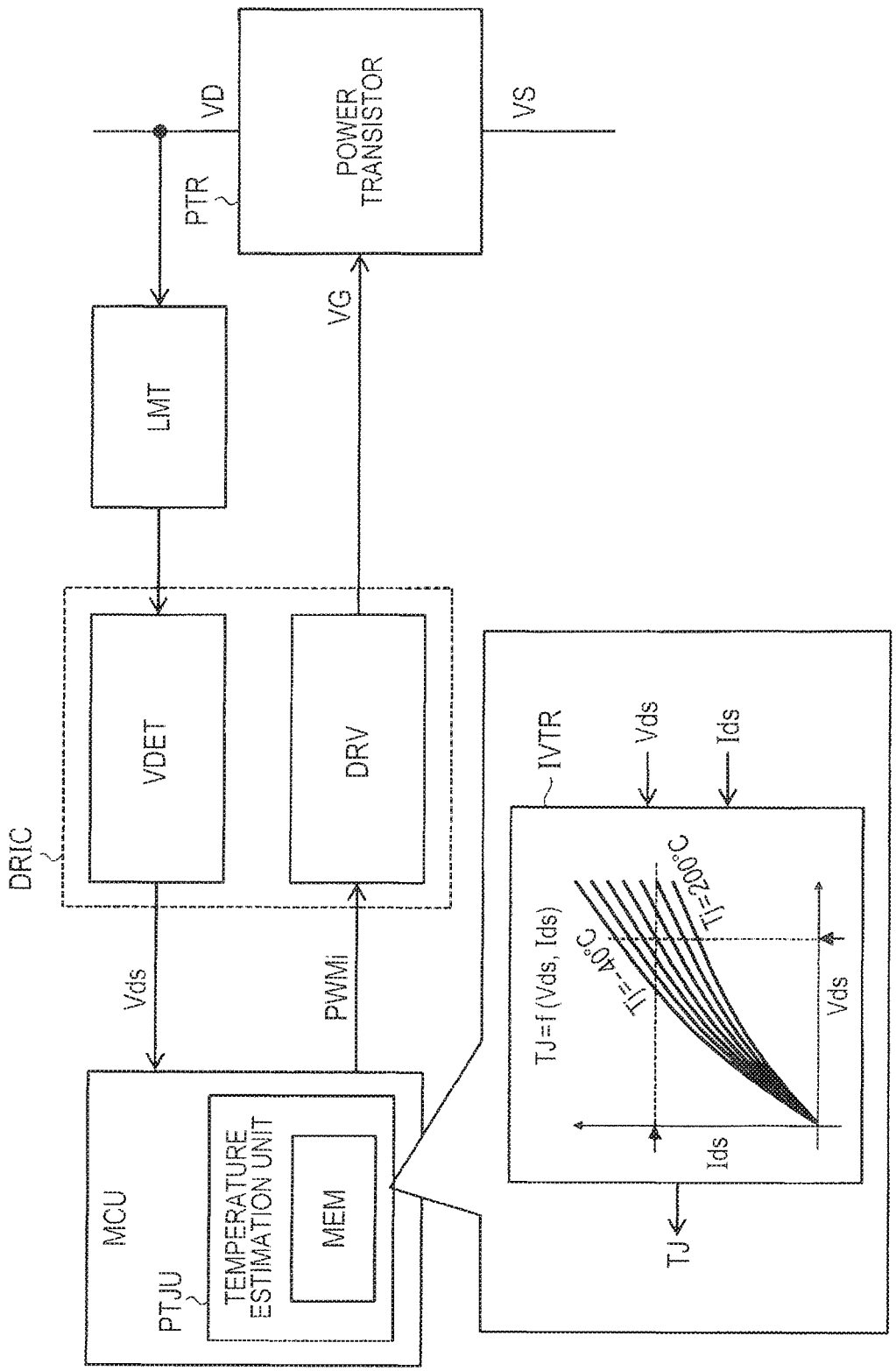
FIG. 1 is a schematic view showing a structural example of amain portion of a power conversion device according to a first embodiment of the invention.

In the following description, the subject matter will be divided into a plurality of sections or embodiments if necessary for the sake of convenience; however, they are not unrelated to each other unless otherwise specified, but are in such a relation that one represents a modified example, details, supplementary explanation, or the like of a part or all of the other. Further, in the following embodiments, if reference is made to any number of elements or the like (including the number of units, numeric value, quantity, range, and the like), the invention is not to be restricted to that value but the number may be more or less than the value unless otherwise explicitly specified and apparently limited to a specific value in principle.

Further, in the following embodiments, it is needless to say that the components (including the operational steps) are not necessarily essential unless otherwise explicitly specified and apparently considered to be essential in principle. Similarly, in the following embodiments, if reference is made to a shape, a positional relationship, or the like of any component or the like, those substantially approximate or similar to that shape or the like are to be included unless otherwise explicitly specified and apparently considered to be different in principle. This is the same with the above-mentioned numeric value and range.

Hereinafter, the embodiments of the invention will be described according to the drawings. In all the drawings for use in describing the embodiments, the same reference numerals are attached to the same members and their description is not repeated.

First Embodiment

<Schematic Structure of Main Portion of Power Conversion Device>

FIG. 1 is a schematic view showing the main portion of a power conversion device according to a first embodiment of the invention. The power conversion device shown in FIG. 1 includes a power transistor PTR, a voltage limiter LMT, a driver device DRIC, and a control device MCU. The power transistor PTR is typically an Insulated Gate Bipolar Transistor (IGBT) or a Metal Oxide Semiconductor Field Effect Transistor (MOSFET) of Si or SiC structure. This specification takes the case where the power transistor PTR is the MOSFET of the SiC structure as an example, any MOSFET of Si, GaN, or the like can be used and in the case of the IGBT, a source and a drain may be respectively replaced with an emitter and a collector.

The power transistor PTR includes a gate terminal (control input terminal), a source terminal, and a drain terminal, to supply electric power to a predetermined load through the source terminal and the drain terminal. The voltage applied between the source and drain (usually, almost power supply voltage) becomes some hundreds V (for example, 400 V) or more than thousand V depending on the case. The power transistor PTR is formed by, for example, one package part or module part.

The driver device DRIC includes a driver DRV and a voltage detection circuit VDET and is formed by, for example, one package. The driver DRV drives a gate terminal of the power transistor PTR with a gate voltage VG. The voltage detection circuit VDET detects an inter-terminal voltage Vds between the source terminal (source voltage VS) and the drain terminal (drain voltage VD) during the on-period of the power transistor PTR. The driver device DRIC operates with the power supply voltage of some V to some tens V (for example, 20 V and the like). As the result, it becomes difficult to directly transmit the inter-terminal voltage Vds to the voltage detection circuit VDET. Therefore, restricting the upper limit of the inter-terminal voltage Vds, the voltage limiter LMT transmits the above voltage to the voltage detection circuit VDET.

The control device MCU is, for example, a microcontroller including a Central Processing Unit (CPU), or a Field Programmable Gate Array (FPGA), and made by one semiconductor chip. The control device MCU controls the on and off of the power transistor PTR through the driver DRV. Here, the control device MCU includes, for example, a temperature estimation unit PTJU installed through program processing using the CPU.

The temperature estimation unit PTJU previously stores correlation information IVTR between an inter-terminal voltage Vds and an inter-terminal current Ids between the source terminal and the drain terminal and a junction temperature TJ of the power transistor PTR into a memory unit MEM. The correlation information IVTR is stored in the memory unit MEM concretely in a format of a conversion table or a calculation formula. The memory unit MEM is, for example, a non-volatile memory such as a flash memory and the like. The temperature estimation unit PTJU estimates the junction temperature TJ, based on the inter-terminal voltage Vds obtained from the voltage detection circuit VDET, the known inter-terminal current Ids, and the correlation information IVTR.

In short, the characteristics of the inter-terminal voltage Vds and the inter-terminal current Ids of the power transistor PTR have a temperature dependency. By using this, the temperature estimation unit PTJU previously holds the electrical characteristics including this temperature dependency as the correlation information IVTR and estimates the junction temperature TJ by reference to the correlation information IVTR with the inter-terminal voltage Vds and the inter-terminal current Ids as the input parameters. According to this method, the junction temperature TJ of the power transistor PTR is estimated using the electrical characteristics directly obtained from the power transistor PTR, hence to improve the estimation accuracy. Further, the voltage limiter LMT is previously provided in a DESAT detection circuit and the like described later in many cases, and by using this, any additional part does not have to be required. As the result, it is possible to estimate the accurate junction temperature TJ at a lower cost or with smaller area overhead.

Here, the control device MCU controls the inter-terminal current Ids (furthermore, the load current) of the power transistor PTR to approach a target, in a general power conversion device. As a representative example, a current sensor is previously provided on a channel of a load current and the control device MCU controls the power transistor PTR according to a Pulse Width Modulation (PWM) signal PWMi so that the current detected value by the current sensor may agree with the known current target value. As mentioned above, the inter-terminal current Ids becomes a known value according to this control.

<Detailed Structure of Main Portion of Power Conversion Device>

Figure 2:
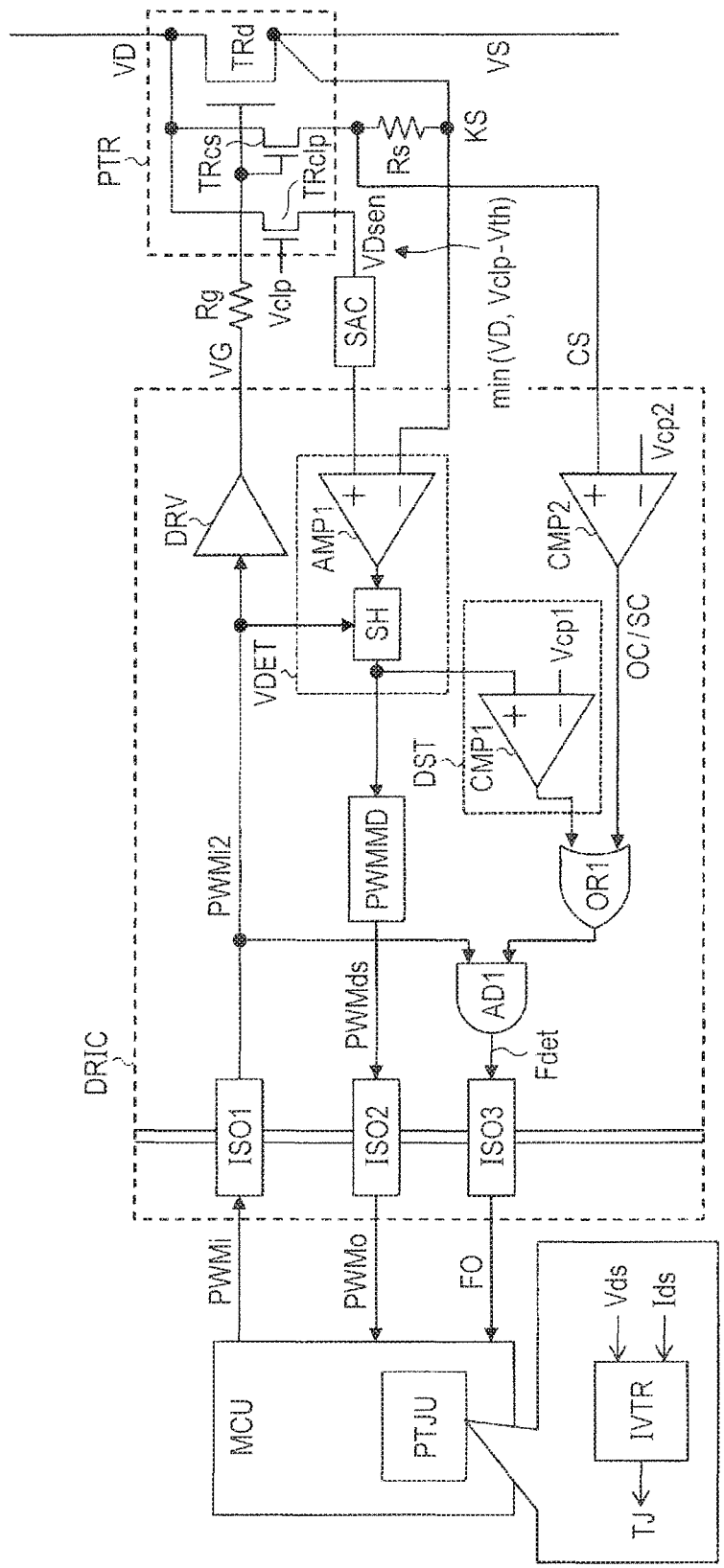
FIG. 2 is a circuit diagram showing the detailed structural example of the power conversion device in FIG. 1.

FIG. 2 is a circuit diagram showing a detailed structural example of the power conversion device in FIG. 1. In FIG. 2, the power transistor PTR includes a driving transistor TRd, a current sensing transistor TRcs, and a clamping transistor TRclp. The current sensing transistor TRcs is formed in a smaller size than the driving transistor TRd and has a gate terminal (gate voltage VG) and a drain terminal (drain voltage VD) in common with the driving transistor TRd.

A resistance element Rs for current detection is joined between the source terminal of the current sensing transistor TRcs and the Kelvin terminal (KS) of the driving transistor TRd. The Kelvin terminal (KS) is joined to the source terminal (VS) of the driving transistor TRd, where the load current hardly flows, differently from the source terminal (VS). Therefore, the Kelvin terminal (KS) generates a stable Kelvin source voltage KS with the noise component involved in a parasitic inductor excluded from the source voltage VS. According to the above structure, a sense current almost in proportion to the inter-terminal current Ids of the driving transistor TRd flows in the current sensing transistor TRcs. When the driving transistor TRd does not include the Kelvin terminal (KS), the source terminal (VS) may be used instead of the Kelvin terminal (KS).

The clamping transistor TRclp is formed in a smaller size than the driving transistor TRd and has a drain terminal in common with the driving transistor TRd. The clamping transistor TRclp forms the voltage limiter LMT shown in FIG. 1. A clamp voltage Vclp with the above-mentioned upper limit of the voltage limiter LMT defined is applied to the gate terminal of the clamping transistor TRclp. The clamp voltage Vclp may be the gate voltage VG depending on the case. In other words, the gate terminal of the driving transistor TRd can be used in common with the clamping transistor TRclp.

A drain detection voltage Dsen corresponding to the drain voltage VD of the driving transistor TRd is output from the source terminal of the clamping transistor TRclp. More specifically, the drain detection voltage Dsen becomes a smaller one of the drain voltage VD and the voltage obtained by subtracting a threshold voltage Vth of the clamping transistor TRclp from the clamp voltage Vclp.

The driver device DRIC includes the driver DRV, a voltage detection circuit VDET, a DESAT detection circuit DST, a comparator CMP2, a PWM modulator PWMMD, AND gate AD1 and OR gate OR1, and isolators ISO1 to ISO3. The isolators ISO1 to ISO3 are, for example, photo couplers or insulation transformers. The isolator ISO1 receives on-off control signal (for example, PWM signal PWMi) of the power transistor PTR from the control device MCU and outputs the same as a PWM signal PWMi2. Upon receipt of the PWM signal PWMi2, the driver DRV drives the gate terminal of the driving transistor TRd through the gate resistance element Rg.

The voltage detection circuit VDET includes a sampling holding circuit SH, and it may also include an amplifier circuit AMP1. The amplifier circuit AMP1 detects, for example, a difference voltage between the drain detection voltage Dsen and the Kelvin source voltage KS through a surge absorption circuit SAC and amplifies the above with a predetermined gain. The sampling holding circuit SH operates upon receipt of the on-off control signal (PWM signal PWMi2) of the power transistor PTR from the control device MCU and the output signal of the amplifier circuit AMP1. The output signal of the amplifier circuit AMP1 actually indicates the inter-terminal voltage Vds during the on-period of the power transistor PTR, according to the clamping transistor TRclp. The sampling holding circuit SH samples the inter-terminal voltage Vds during the on-period of the power transistor PTR, while the PWM signal PWMi2 is during the he on-period, and holds the sampling value in the off-period.

The DESAT detection circuit DST includes a comparator CMP1 and determines whether the power transistor PTR is saturated or not by comparison between the inter-terminal voltage Vds detected by the voltage detection circuit VDET and a predetermined voltage determination value Vcp1. For example, when an over-current occurs, the power transistor PTR is in a non-saturated state and the inter-terminal voltage Vds gets larger. The DESAT detection circuit DST detects this state.

Here, for example, the threshold value voltage Vth of the clamping transistor TRclp is about 5 V and the voltage determination value Vcp1 of the DESAT detection circuit DST is about 7 V. In this case, the clamping transistor TRclp has to transfer the voltage larger than 7 V as the drain detection voltage Dsen corresponding to the drain voltage VD and therefore, has to satisfy "Vclp−Vth>7V". As the result, the clamp voltage Vclp has to be larger than 12 V, and preferably, for example, 15 V.

The comparator CMP2 works as the over-current detection circuit and determines whether or not there is an over-current in the driving transistor TRd, by comparison between the sense voltage CS (the value almost in proportion to the inter-terminal current Ids) from the resistance element Rs for current detection and a predetermined voltage determination value Vcp2 (actually corresponding to the current determination value of the inter-terminal current Ids). Further, by using two types of the voltage determination values Vcp2 (for example, 0.25 V and 0.5 V), for example, the comparator CMP2 can determine whether or not there is a short-circuit, in addition to the determination of the over-current. When there is the over-current, the comparator CMP2 outputs an over-current detection signal OC and when there is the short-circuit current, it outputs a short-circuit current detection signal SC.

The PWM modulator PWMMD PWM-modulates the inter-terminal voltage Vds detected by the voltage detection circuit VDET, hence to generate a PWM signal PWMds. Upon receipt of the PWM signal PWMds, the isolator ISO2 outputs the above to the control device MCU as a PWM signal PWMo. As the isolator ISO2 cannot transmit any other than the digital signal, the PWM modulator PWMMD is provided in this example. However, any circuit capable of converting (modulating) into digital signal can be provided; instead of the PWM modulator PWMMD, for example, $\Delta\Sigma$ modulator or an analog digital converter may be used.

When a failure is detected in at least one of the DESAT detection circuit DST and the comparator CMP2 (over-current detection circuit), the OR gate OR1 outputs "H" level. The AND gate AD1 supplies the output of the OR gate OR1 as a failure detection signal Fdet, during the on-period ("H" level period) of the PWM signal PWMi2 from the isolator ISO1. Upon receipt of the failure detection signal Fdet, the isolator ISO3 outputs a failure output signal FO to the control device MCU.

Upon receipt of the PWM signal PWMo from the isolator ISO2, the control device MCU demodulates the above to obtain the inter-terminal voltage Vds. The control device MCU estimates the junction temperature TJ based on the inter-terminal voltage Vds, the known inter-terminal current Ids, and the correlation information IVTR, as mentioned in FIG. 1 and reflects the result to the PWM signal PWMi, hence to protect the power transistor PTR. Specifically, there is a method of restricting the PWM duty until the junction temperature TJ gets lower. Further, upon receipt of the failure output signal FO from the isolator ISO3, the control device MCU turns off the driving transistor TRd through the PWM signal PWMi depending on the necessity, hence to protect the power transistor PTR.

As mentioned above, in the structural example of FIG. 2, the sampling holding circuit SH is provided. The sampling holding circuit SH outputs only the inter-terminal voltage Vds corresponding to the on-period of the power transistor PTR (in other words, the voltage corresponding to the off-period is not output), for example, even when the on-period of the PWM signal PWMi2 is short. As the result, for example, in the DESAT detection circuit DST and the PWM modulator PWMMD, a timing design and the like targeted for the on-period of the power transistor PTR are not necessary, thereby making the circuit design and the processing easy.

Further, the power transistor PTR is arranged, for example, at a high side (high potential side) or a low side (low potential side) of the inverter and the like. When it is arranged at the high side, the control device MCU operates with the 0 V level as a reference and the driver device DRIC operates with the source voltage VS at the high side (for example, a voltage shifting between 0 V level and some hundreds V level) as a reference; therefore, the isolators ISO1 to ISO3 are required. On the other hand, when it is arranged at the low side, the driver device DRIC operates with the source voltage VS at the low side as a reference, the isolators ISO1 to ISO3 may be unnecessary depending on the case. Since a difference voltage can be generated between the ground power supply voltage of the driver device DRIC and the source voltage VS at the low side, according to the parasitic inductance, actually the isolators ISO1 to ISO3 are required in some cases.

<Structure of Power Transistor (Semiconductor Device)>

Figure 3B:
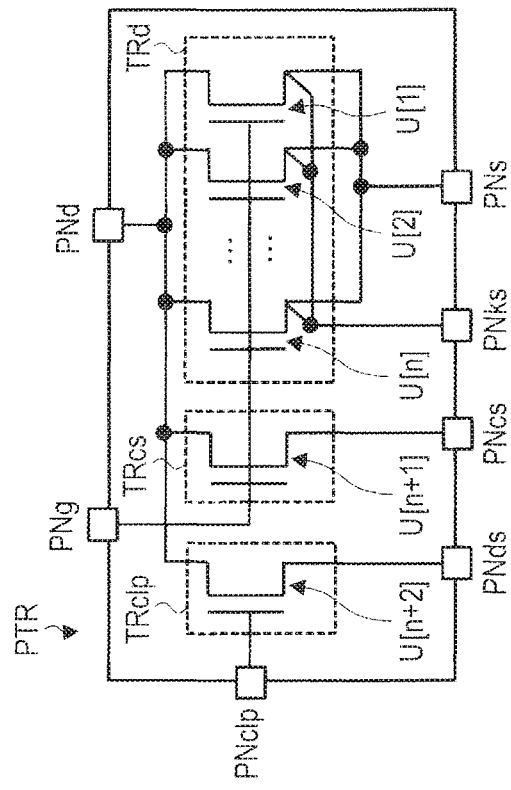
FIGS. 3A and 3B are schematic views showing the structural examples of the power transistor in FIG. 2.
Figure 3A:
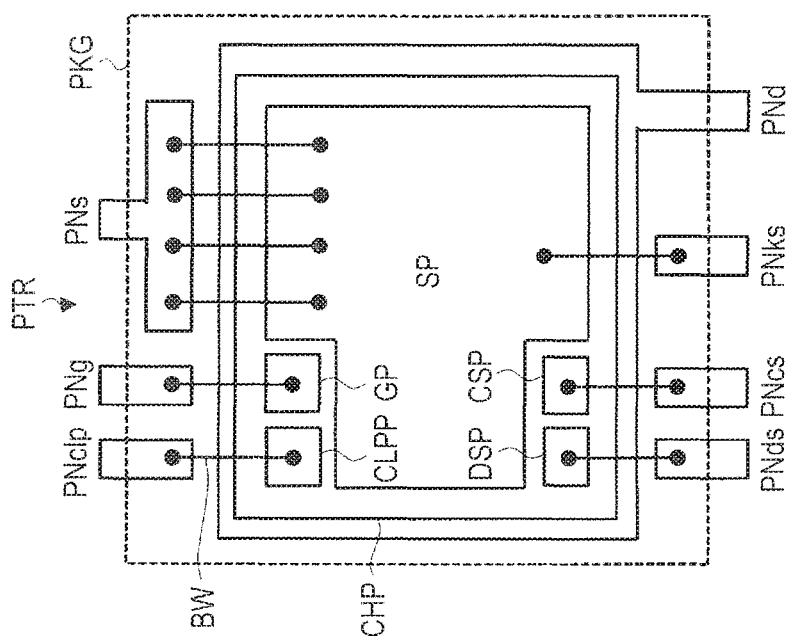

FIG. 3A and FIG. 3B are schematic views showing structural examples of the power transistor in FIG. 2. As shown in FIG. 3A, the power transistor (MOSFET of the SiC structure) PTR is formed on the semiconductor chip CHP, and a source pad SP, a gate pad GP, a clamp input pad CLPP, a current sense pad CSP, and a voltage sense pad DSP are formed on the surface of the semiconductor chip CHP. The semiconductor chip CHP is sealed by a package PKG including external terminals (lead or lead frame) PNs, PNks, PNd, PNg, PNclp, PNcs, and PNds.

The external terminals PNs and PNks are respectively the source terminal and the Kelvin terminal and are joined to the source pad SP through bonding wire BW. The external terminal (source terminal) PNs is a terminal for supplying an electric power to a predetermined load, where almost all the inter-terminal currents Ids flow. While, the external terminal (Kelvin terminal) PNks is a terminal for supplying the ground power supply voltage GND to the driver device DRIC, where actually no inter-terminal current Ids flows. Therefore, the external terminal (Kelvin terminal) PNks is rarely affected by the parasitic inductance caused by the bonding wire BW and the external terminal.

The external terminal PNd is the drain terminal and is joined to the drain pad formed on the rear surface of the semiconductor chip CHP. The external terminals PNg and PNclp are respectively the gate terminal and a clamp input terminal and are joined to the gate pad GP and the clamp input pad CLPP through the bonding wire BW. The external terminals PNcs and PNds are respectively a current sensing terminal and a voltage sensing terminal and are respectively joined to a current sensing pad CSP and a voltage sensing pad DSP through the bonding wire BW.

A plurality (for example, some thousands) of unit transistors U[1] to U[n], U[n+1], and U[n+2] each including a source node, a drain node, and a gate node (control input node) are formed on the semiconductor chip CHP, as illustrated in FIG. 3B. The above semiconductor chip CHP is provided with the driving transistor TRd, the current sensing transistor TRcs, and the clamping transistor TRclp, according to the allocation of the unit transistors.

The number of the unit transistors forming the current sensing transistor TRcs is less than the number of the unit transistors forming the driving transistor TRd (here, n units) and about some units (in this example, 1 unit (U[n+1])). The number of the unit transistors forming the clamping transistor TRclp is also less than the number (n) of the unit transistors forming the driving transistor TRd and about some units (in this example, 1 unit (U[n+2])).

The external terminal (gate terminal) PNg is joined to the gate node (gate pad GP) of the driving transistor TRd and the current sensing transistor TRcs in common. The external terminal (source terminal) PNs and the external terminal (Kelvin terminal) PNks are joined to the source node (source pad SP) of the driving transistor TRd. The external terminal (drain terminal) PNd is joined to the drain node (drain pad) of the driving transistor TRd, the current sensing transistor TRcs, and the clamping transistor TRclp in common.

The external terminal (current sensing terminal) PNcs is joined to the source node (current sensing pad CSP) of the current sensing transistor TRcs. The external terminal (voltage sensing terminal) PNds is joined to the source node (voltage sensing pad DSP) of the clamping transistor TRclp. The external terminal (clamp input terminal) PNclp is joined to the gate node (clamp input pad CLPP) of the clamping transistor TRclp. In this example, the clamp input pad CLPP and the clamp input terminal PNclp are provided; depending on the case, however, these are not provided but the gate node of the clamping transistor TRclp can be joined to the external terminal (gate terminal) PNg.

Figure 4:
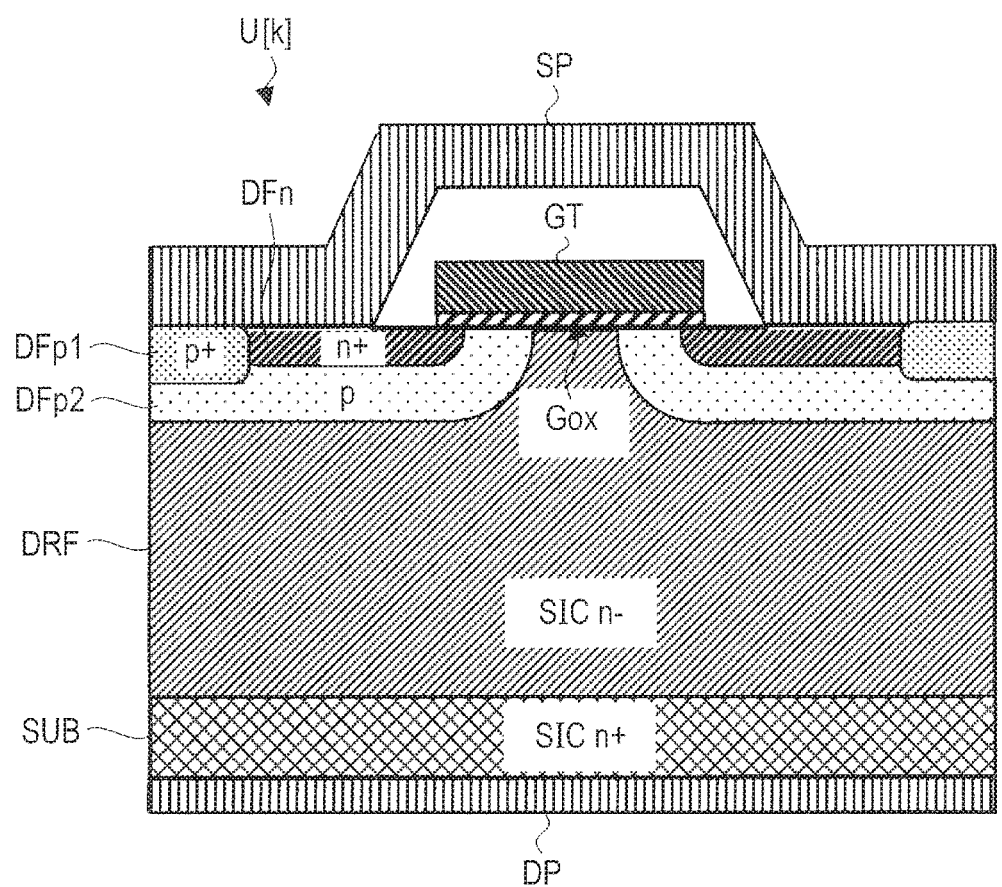
FIG. 4 is a cross-sectional view showing a composition example of each unit transistor in FIG. 3B.

FIG. 4 is a cross-sectional view showing a composition example of each unit transistor in FIG. 3B. FIG. 4 shows the composition example of a vertical MOSFET of the SiC structure as one example of the unit transistor U[k]. The semiconductor substrate SUB is formed of an $n^+$ type SiC semiconductor. An n− type drift layer DRF is formed on the semiconductor substrate SUB. A p type diffusion layer DFp2 is formed within the drift layer DRF, and an $n^+$ type diffusion layer DFn and a $p^+$ type diffusion layer DFp1 are formed therein. A gate layer GT is formed on the top of the $p^+$ type diffusion layer DFp1 through a gate insulating film Gox.

On the side of the main surface, the diffusion layer DFp1 and the diffusion layer DFn are coupled to the source pad SP and on the side of the rear surface, the semiconductor substrate SUB is coupled to the drain pad DP. The n channel is formed in the diffusion layer DFp2 by applying a predetermined gate voltage VG to the gate layer GT. As the result, the diffusion layer DFn coupled to the source pad SP is conducted with the semiconductor substrate SUB and the drift layer DRF coupled to the drain pad DP through the n channel. The diffusion layer DFp1 becomes a power feeding layer to the diffusion layer DFp2. By using the MOSFET of the SiC structure, it is possible to reduce the on-resistance and the loss of the power conversion device more than, for example, in the case of using the Si structure.

As mentioned above, by forming the clamping transistor TRclp on the same semiconductor chip CHP as the driving transistor TRd, the cost can be reduced more than, for example, in the case of mounting the clamping transistor TRclp as another external part. Under the assumption that every part is made in one chip, for example, the MOSFET of the SiC structure is preferable to the IGBT as the power transistor PTR. In the case of the IGBT, a voltage drop between the collector and the emitter is larger and further the voltage drop has a temperature dependency to some degree. As the result, according to the voltage drop of the clamping transistor, some degree of error occurs between the drain voltage VD and the drain detection voltage Dsen. On the other hand, in the case of the MOSFET of the SiC structure, this problem hardly occurs. In this viewpoint, the MOSFET is not restricted to the SiC structure but may be of the Si structure. From the viewpoint of achieving a high breakdown voltage and a low on-resistance in both ways, the SiC structure is preferable.

<Structural Example of Surge Absorption Circuit>

Figure 5:
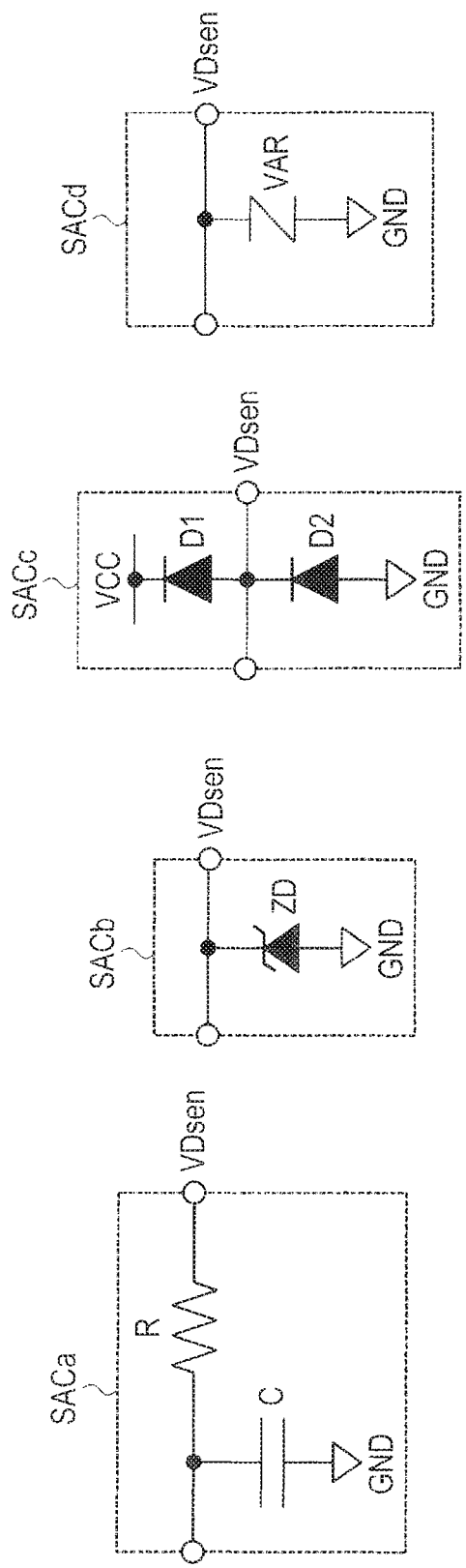
FIG. 5 is a circuit diagram showing various structural examples of a surge absorption circuit in FIG. 2.

FIG. 5 is a circuit diagram showing various structural examples of the surge absorption circuit in FIG. 2. The surge absorption circuit SAC in FIG. 2 is provided to absorb a noise (surge) that could be superimposed on the drain voltage VD. In the structural examples of FIG. 2, the surge absorption circuit SAC is provided on the side of the drain voltage VD; in addition to this, the same surge absorption circuit SAC may be provided on the side of the source voltage VS (Kelvin source voltage KS).

In FIG. 5, the surge absorption circuit SACa is a low pass filter that filters the drain detection voltage Dsen with the resistance element R and the capacity C. The surge absorption circuit SACb is provided with a Zener diode ZD between the drain detection voltage Dsen and the ground power supply voltage GND, to restrict the maximum voltage of the drain detection voltage Dsen to the Zener voltage. The surge absorption circuit SACc is provided with diode D1 between the drain detection voltage Dsen and the power supply voltage VCC and with diode D2 between the drain detection voltage Dsen and the ground power supply voltage GND, to restrict the voltage range of the drain detection voltage Dsen to the range between the power supply voltage VCC and the ground power supply voltage GND.

The surge absorption circuit SACd is provided with a varistor element VAR between the drain detection voltage Dsen and the ground power supply voltage GND, to restrict the maximum voltage of the drain detection voltage Dsen to a voltage defined by the varistor element VAR. The varistor element VAR is an element in which when the difference voltage between the both ends is low, the resistance value is higher and when the difference voltage rises up more than a certain degree, the resistance value rapidly reduces.

<Operation of Main Portion of Driver Device>

Figure 6:
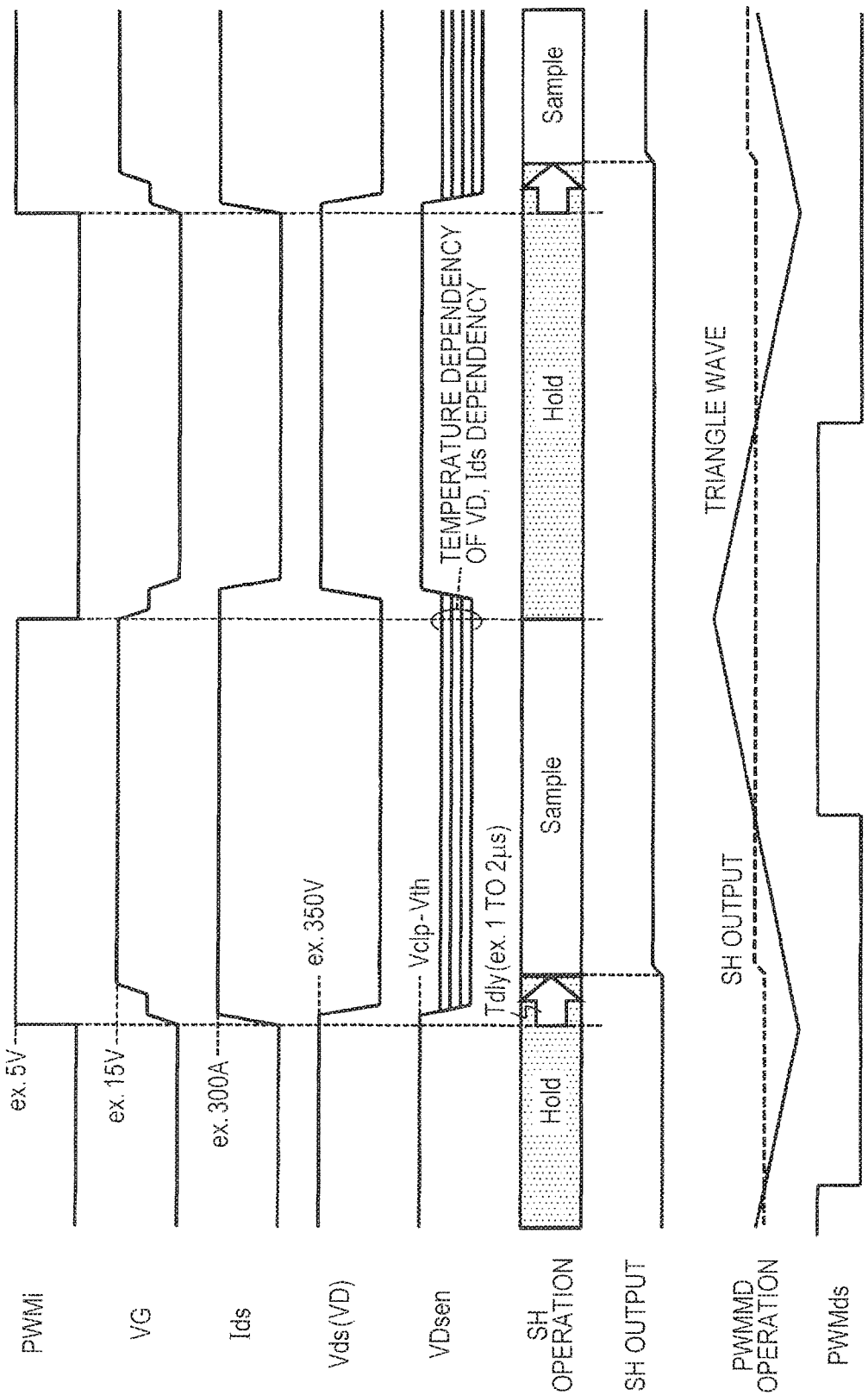
FIG. 6 is a timing chart showing an operation example of the main portion of a driver device in FIG. 2.

FIG. 6 is a timing chart showing an operation example of the main portion of the driver device in FIG. 2. In FIG. 6, when the PWM signal PWMi shifts to the on level ("H" level), the gate voltage VG rises up through the driver DRV. According to this, the inter-terminal current Ids increases, and then, the inter-terminal voltage Vds (drain voltage VD) decreases. For example, in the inverter and the like, in the state where a reflux current flows in one of the high side and the low side, when the above current is switched to the other driving current, the drain voltage VD does not shift until the reflux current is completely switched to the driving current because one reflux diode is turned on.

On the other hand, when the PWM signal PWMi shifts to the off level ("L" level), the gate voltage VG falls through the driver DRV. According to this, the inter-terminal voltage Vds (drain voltage VD) increases, and then, the inter-terminal current Ids decreases. In other words, in the state where the driving current flows in one of the high side and the low side, when the above current is switched to the other reflux current, the drain voltage VD increases and the other reflux diode is turned on, then to start the switching to the reflux current (that is, decrease of the inter-terminal current Ids).

As mentioned above, in the actual switching operation, the drain voltage VD shifts after elapse of some time from the PWM signal PWMi shifting to the on level ("H" level). According to this, the drain detection voltage Dsen also gets a stable level after the elapse of some time from the PWM signal PWMi shifting to the on level. Receiving the shift of the PWM signal PWMi to the on level, the sampling holding circuit SH starts the sampling operation, to get this stable level, after a predetermined delay time Tdly. The delay time Tdly is, for example, 1 to 2 μs.

Upon receipt of the shift of the PWM signal PWMi to the off level, the sampling holding circuit SH starts the holding operation. According to this operation, the sampling holding circuit SH always outputs the inter-terminal voltage Vds (drain voltage VD) in the normal state during the on-period of the PWM signal PWMi (power transistor PTR). The PWM modulation circuit PWMMD and the DESAT circuit DST can process the output signal of the sampling holding circuit SH, without particularly defining the operation period. For example, the PWM modulation circuit PWMMD can always compare the output signal of the sampling holding circuit SH with the triangle wave generated internally, as shown in FIG. 6 and according to this, it can generate the PWM signal PWMds having the PWM duty corresponding to the inter-terminal voltage Vds.

<Structure of Voltage Limiter (Modified Example)>

Figure 7:
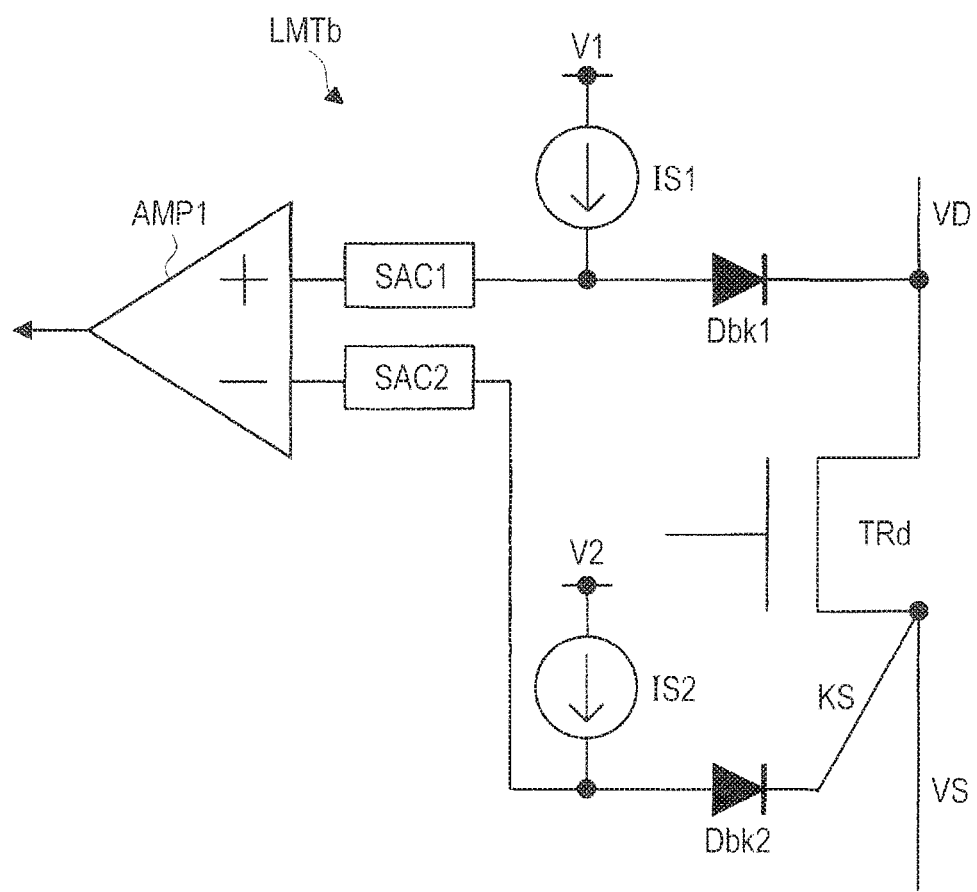
FIG. 7 is a circuit diagram showing a structural example of the voltage limiter in FIG. 1, different from FIG. 2.

FIG. 7 is a circuit diagram showing a structural example of the voltage limiter in FIG. 1, different from FIG. 2. The voltage limiter LMTb shown in FIG. 7 includes an amplifier circuit AMP1, surge absorption circuits SAC1 and SAC2, blocking diodes Dbk1 and Dbk2, and current sources IS1 and IS2. The blocking diode Dbk1 and the surge absorption circuit SAC1 are inserted in series between the drain terminal (VD) of the driving transistor TRd and the (+) input of the amplifier circuit AMP1. By the passage of a minute current to the blocking diode Dbk1 from the current source IS1, the (+) input voltage of the amplifier circuit AMP1 is almost restricted to the voltage V1 of the current source IS1.

Similarly, the blocking diode Dbk2 and the surge absorption circuit SAC2 are inserted in series between the Kelvin terminal (KS) of the driving transistor TRd and the (−) input of the amplifier circuit AMP1. By the passage of a minute current to the blocking diode Dbk2 from the current source IS2, the (−) input voltage of the amplifier circuit AMP1 is almost restricted to the voltage V2 of the current source IS1.

In the general DESAT circuit, for example, a method of providing a blocking diode on the side of the drain voltage VD, as shown in U.S. Pat. No. 4,954,917, is often used. This method, however, may generate a voltage error according to the forward direction voltage of the blocking diode. In the structural example of FIG. 7, the two blocking diodes Dbk1 and Dbk2 are used to cancel the forward direction voltage, hence to reduce the voltage error. In this case, although the error can be reduced, some additional part is required, hence to increase the cost and the area. In this viewpoint, the clamping transistor TRclp shown in FIGS. 2 and 3 is useful.

<Structure of Temperature Estimation Unit (Application Example)>

Figure 8A:
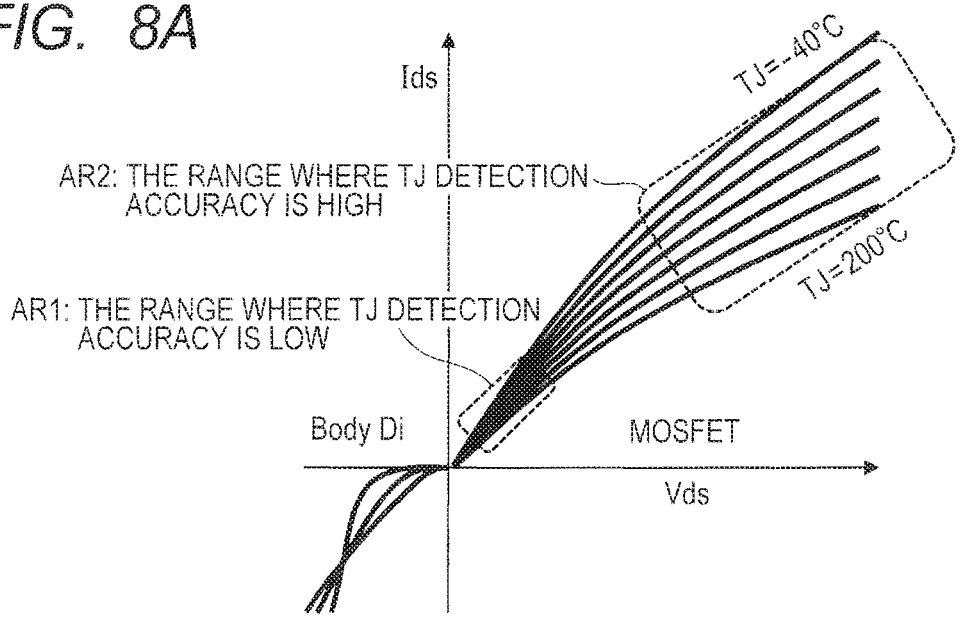
FIG. 8A is a view for use in describing an example of a problem that may occur in a temperature estimation unit in FIG. 2
Figure 8B:
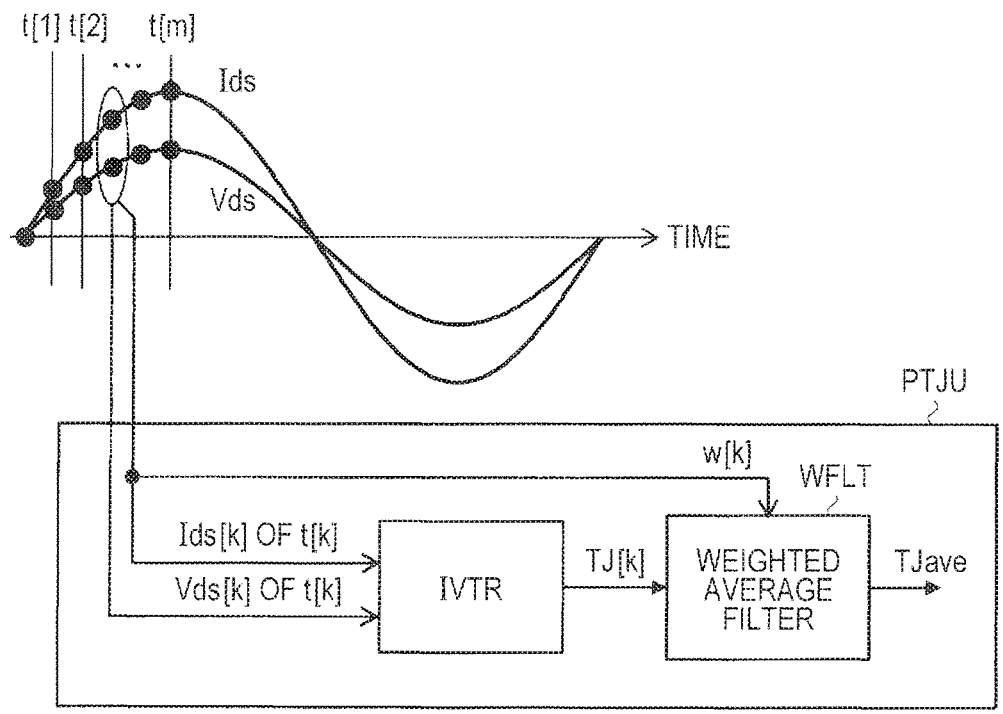
FIG. 8B is a schematic view showing a structural example of the temperature estimation unit to solve the problem of FIG. 8A.

FIG. 8A is a View for Use in Describing One Example of a Problem that could be generated in the temperature estimation unit of FIG. 2, and FIG. 8B is a schematic view showing a structural example of the temperature estimation unit to solve the problem of FIG. 8A. As shown in FIG. 8A, in the actual operation, a variation amount according to the temperature dependency relatively gets smaller in the range AR1 having smaller inter-terminal voltage Vds and inter-terminal current Ids, and accordingly the estimation accuracy of the junction temperature TJ deteriorates. On the contrary, in the range AR2 having larger inter-terminal voltage Vds and inter-terminal current Ids, the variation amount according to the temperature dependency relatively gets larger and therefore, the estimation accuracy of the junction temperature TJ increases.

To enhance the estimation accuracy of the junction temperature TJ, one of the following two methods is useful. As a first method, when the inter-terminal voltage Vds or the inter-terminal current Ids is smaller than a predetermined reference value (in short, in the range AR1 of FIG. 8A), the temperature estimation is not performed. This method is easy to install but in the actual operation, there is the period when the temperature estimation is not performed and depending on the case, the real time performance may be damaged. As a second method, the temperature estimation unit PTJU is provided with a weighted average filter WFLT, as shown in FIG. 8B.

The weighted average filter WFLT weights a plurality of junction temperatures TJ[k] (k=1, 2, . . . ) estimated at each time t[1], t[2], . . . by the size of the corresponding inter-terminal voltage Vds[k] or inter-terminal current Ids[k] and then averages the above. Specifically, the weighted average filter WFLT calculates, for example, the respective junction temperatures TJ[k] (k=1, . . . , m) obtained at the respective times (sampling points) t[k] (k=1, . . . , m), in the formula (1), to obtain the average junction temperature TJave. Where, "w[k] (k=1, . . . , m)" is a weight coefficient and defined at a value in proportion to the size of the inter-terminal voltage Vds[k] or the inter-terminal current Ids[k].

$$TJave=(w[1] \times TJ[1]+ \quad . \quad . \quad . \quad +w[m] \times TJ[m])/ (w[1]+ \ldots +w[m]) \quad (1)$$

<Schematic Structure of Main Portion of Power Conversion Device (Application Example)>

Figure 9:
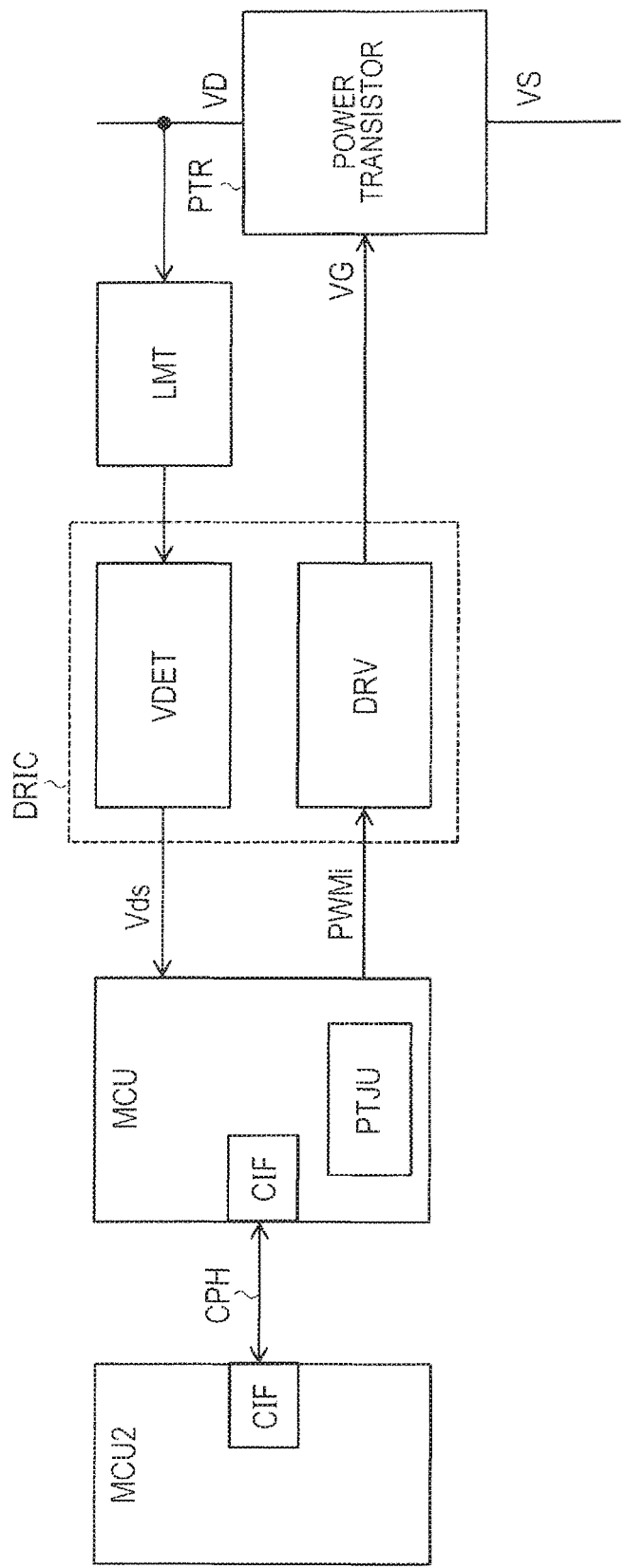
FIG. 9 is a schematic view showing an extended structural example of the power conversion device in FIG. 1.

FIG. 9 is a schematic view showing an extended structural example of the power conversion device of FIG. 1. In the structural example of FIG. 9, a control device MCU2 is further added to the structural example of FIG. 1. The control device MCU2 is formed by, for example, a microcontroller, and manages the upper system including the power conversion device of FIG. 1. The control device MCU2 of the upper system is joined to the control device MCU within the power conversion device of FIG. 1 by a communication channel CPH, to communicate with each other through each communication interface CIF. The communication protocol, for example, Controller Area Network (CAN) and Serial Peripheral Interface (SPI) is applied to the communication interfaces CIF.

The control device MCU transmits the information of the estimated junction temperature TJ to the control device MCU2 through the communication channel CPH. For example, the control device MCU2 records the shift of the junction temperature TJ or displays the above shift on a display, based on the information. A user can understand, for example, a problem of the system, based on the shift of the junction temperature TJ.

<Main Effects of First Embodiment>

Figure 20:
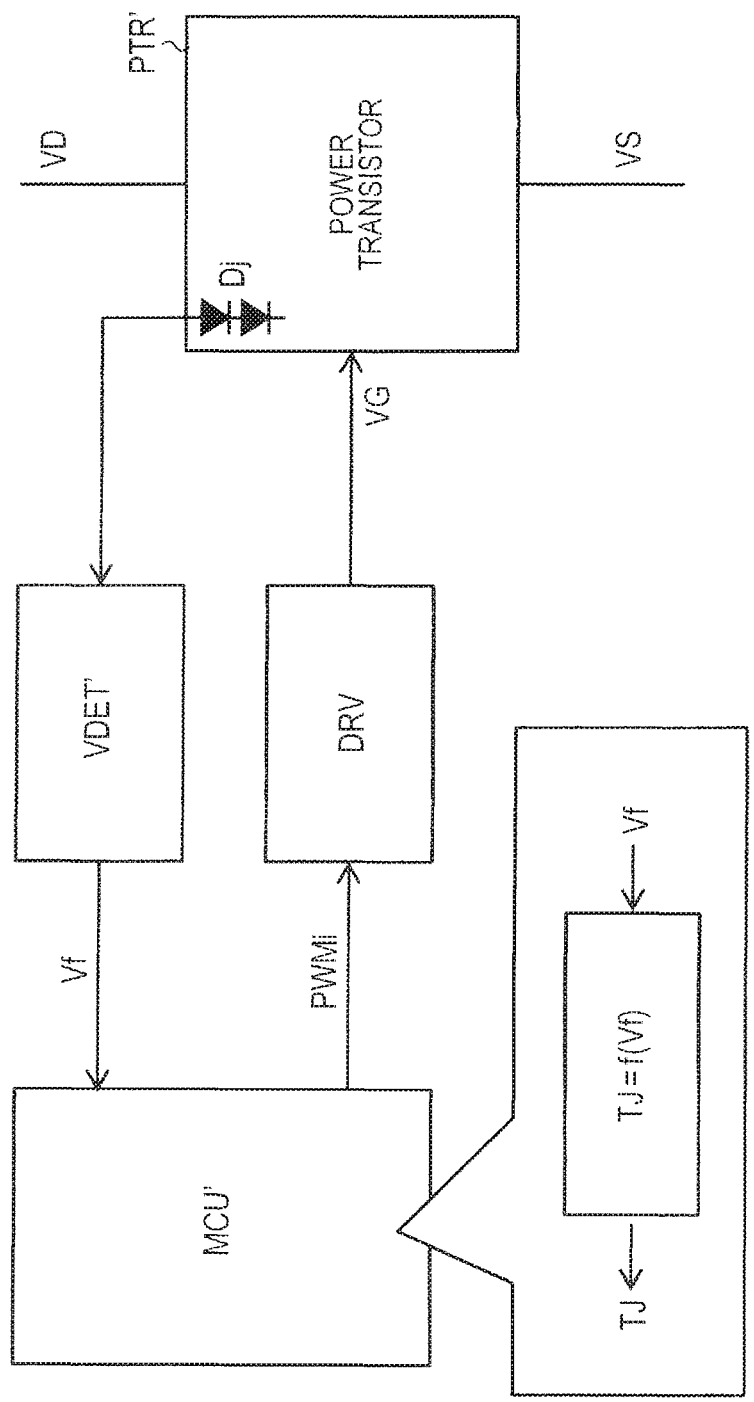
FIG. 20 is a schematic view showing a structural example of the main portion of a power conversion device as a comparison example of the invention.

FIG. 20 is a schematic view showing a structural example of the main portion of a power conversion device in a comparison example of the invention. In the power conversion device shown in FIG. 20, a temperature detecting diode Dj is mounted within the power transistor PTR'. The voltage detection circuit VDET' detects the forward direction voltage Vf of the diode Dj and the control device MCU' estimates the junction temperature TJ, based on the forward direction voltage Vf.

The above method is the same as the method of "A new vertical IGBT structure with a monolithic over-current, over-voltage, and over-temperature sensing and protecting circuit" written by N. Iwamuro, et al, IEEE Electron Device Letters, Vol. 16, No. 9, September 1995. The temperature detecting diode Dj is manufactured of, for example, polycrystalline silicon. Therefore, the manufacturing variation is large and there is a fear of increasing the estimation error of the junction temperature TJ. In the power transistor PTR', additional terminal for the diode Dj and additional manufacturing process are required, hence to increase the cost and the mounting area.

On the other hand, as shown in the International Patent Publication No. 2014-091852, a thermister may be used instead of the diode. In this case, however, the thermister is arranged at a distance from the power transistor and therefore, the estimation accuracy of the junction temperature TJ may deteriorate. Further, in the International Patent Publication No. 2014-091852, as mentioned above, the junction temperature is estimated by performing various calculations using the detection result of the thermister. This method, however, requires complicated calculations and the estimation accuracy cannot be fully obtained depending on the estimation algorithm. Further, the thermister as the additional part and the additional terminal related to this are required, hence to increase the cost and the mounting area.

As mentioned above, according to the estimation method of the junction temperature TJ in the comparison example, the estimation error may be enlarged as a first problem. As a second problem, the additional part, terminal, and manufacturing process are required, thereby increasing the cost and the mounting area.

On the other hand, according to the method of the first embodiment, the junction temperature TJ is estimated by using the electrical characteristics of the power transistor PTR, which makes it possible to estimate the junction temperature TJ at a high accuracy. As the result, for example, the request margin for the thermal design of the power transistor PTR can be reduced, hence to reduce the cost.

Further, according to the method of the first embodiment, by using the mechanism of the DESAT circuit DST, any additional part and additional terminal are not required and any additional manufacturing process is not required either; therefore, it is possible to estimate the junction temperature TJ at a high accuracy at a low cost or small area overhead. In this case, as the voltage limiter LMT, the clamping transistor TRclp is provided within the power transistor PTR, hence to further reduce the cost and the area.

The characteristics of the inter-terminal voltage Vds and the inter-terminal current Ids particularly have the gate voltage dependency, in addition to the temperature dependency. The gate voltage is determined, for example, by the external power supply voltage supplied to the driver device DRIC and the value of the external power supply voltage is determined at the voltage value on the specification. Actually, however, there is the case of generating an error in the voltage value on the specification, depending on the structure of the power regulator that generates the external power supply voltage. In this case, the control device MCU may obtain the gate voltage from the driver device DRIC, to correct the correlation information IVTR.

Second Embodiment

<Application Example to Motor System>

FIG. 10A is a schematic view showing a structural example of the main portion of a motor system to which a power conversion device according to a second embodiment of the invention is applied, and FIG. 10B and FIG. 10C are views showing the operation example of FIG. 10A. The motor system in FIG. 10A includes a motor MT joined to a load driving terminal OUT, a driving transistor TRdh provided between the load driving terminal OUT and a power supply voltage (power supply voltage at the side of high potential) Vbus, and a driving transistor TRdl provided between the load driving terminal OUT and a ground power supply voltage (power supply voltage at the side of low potential) GND. In the specification, the driving transistor TRdh at the side of the power supply voltage Vbus is called a high side transistor and the driving transistor TRdl at the side of the ground power supply voltage GND is called a low side transistor. The load driving terminal OUT is a terminal for driving one phase of several phases (for example, three phases) included in the motor MT.

The motor system in FIG. 10A includes voltage limiters LMTh and LMTl, voltage detection circuits VDETh and VDETl, drivers DRVh and DRVl, a control device MCU, and a current sensor ISEN. The voltage limiter LMTh, the voltage detection circuit VDETh, and the driver DRVh are provided correspondingly to the high side transistor TRdh, and the voltage limiter LMTl, the voltage detection circuit VDETl, and the driver DRVl are provided correspondingly to the low side transistor TRdl. The current sensor ISEN detects the load current IL flowing to the load driving terminal OUT (motor MT). The control device MCU controls the on and off of the high side transistor TRdh and the low side transistor TRdl according to the complementary PWM signals PWMih and PWMil, so that the load current IL detected by the current sensor ISEN may be a current target value.

FIG. 10B shows the respective states switched by the complementary PWM signals PWMih and PWMil from the control device MCU. In the state ST1, the PWM signal PWMih is during the on-period (the gate voltage VGh of the high side transistor TRdh is the "H" level), and the PWM signal PWMil is during the off-period (the gate voltage VGl of the low side transistor TRdl is the "L" level). In the state ST1, the source operation for supplying the load current IL to the motor MT through the high side transistor TRdh is performed as shown in FIG. 10A.

In the state ST3, the PWM signal PWMih is during the off-period (VGh='L' level) and the PWM signal PWMil is during the on-period (VGl='H' level). In the state ST3, a synchronous rectification operation of flowing back the load current IL through the low side transistor TRdl is performed, as shown in FIG. 10A. In the state ST2, the PWM signals PWMih and PWMil are both during the off-period (VGh, VGl='L' level). The state ST2 is executed in the dead time according to the switching from the state ST1 to the state ST3. In the state ST2, the reflux operation of flowing back the load current IL through the reflux diode at the low side (not illustrated) is performed, as shown in FIG. 10A.

In the state ST4, the PWM signal PWMih is during the off-period (VGh='L' level) and the PWM signal PWMil is during the on-period (VGl='H' level). In the state ST4, a current sink operation of drawing out the load current IL supplied to the motor MT from the high side transistor (not illustrated) of the other phase through the low side transistor TRdl is performed as shown in FIG. 10A. In the state ST6, the PWM signal PWMih is during the on-period (VGh='H' level) and the PWM signal PWMil is during the off-period (VGl='L' level). In the state ST6, the synchronous rectification operation of flowing back the load current IL through the high side transistor TRdh is performed as shown in FIG. 10A. The state ST5 is executed in the dead time according to the switching from the state ST4 to the state ST6. In the state ST5, the reflux operation of flowing back the load current IL through the reflux diode at the high side (not illustrated) is performed as shown in FIG. 10A.

According to the operation, the voltage detection circuit VDETh at the high side can detect the inter-terminal voltage Vds_H in the plus direction in the high side transistor TRdh, in the state ST1, and can detect the inter-terminal voltage Vds_H in the minus direction in the high side transistor TRdh, in the state ST6. The voltage detection circuit VDETl at the low side can detect the inter-terminal voltage Vds_L in the minus direction in the low side transistor TRdl, in the state ST3, and can detect the inter-terminal voltage Vds_L in the plus direction in the low side transistor TRdl, in the state ST4.

Here, for example, when the high side transistor TRdh and the low side transistor TRdl are formed by the MOSFET of the SiC structure as shown in FIG. 4, a pn junction diode (reflux diode) according to the p region (DFp1, DFp2) and the n region (DRF, SUB) is joined between the source and drain. There is the case in which the correlation information IVTR mentioned in the first embodiment is different between the case where the inter-terminal current Ids flows in the plus direction (upwardly in FIG. 4) and the case where the inter-terminal current Ids flows in the minus direction (downwardly in FIG. 4).

The control device MCU preferably holds two types of correlation information corresponding to the respective current directions of the inter-terminal current Ids and switches the two types of the correlation information according to the known current direction to estimate the junction temperature TJ. For example, the control device MCU holds the correlation information (defined as IVTR(+)) corresponding to the inter-terminal current Ids in the plus direction (Vbus OUT at the high side) and the correlation information (defined as IVTR(−)) corresponding to the inter-terminal current Ids in the minus direction (OUT Vbus at the high side).

The control device MCU execute the state ST1→ST2→ST3, during the PWM cycle Tpwm1 when the load current IL flows in the plus direction, as shown in FIG. 10C and executes the state ST4→ST5→ST6, during the PWM cycle Tpwm2 when the load current IL flows in the minus direction. The PWM cycle is, for example, some tens to hundreds μs. According to this control, the control device MCU always grasps the directions of the inter-terminal voltages Vds and inter-terminal currents Ids in the respective driving transistors (TRdh, TRdl). The control device MCU controls the length of each state (specifically, the PWM duty), hence to control the current value of the load current IL.

In this operation, the control device MCU uses the correlation information (IVTR(+)) in the plus direction in the state ST1 within the PWM cycle Tpwm1 and the correlation information (IVTR(−)) in the minus direction in the state ST6 within the PWM cycle Tpwm2, to estimate the junction temperature TJ of the high side transistor TRdh. Similarly, the control device MCU uses the correlation information (IVTR(−)) in the minus direction in the state ST3 within the PWM cycle Tpwm1 and the correlation information (IVTR(+)) in the plus direction in the state ST4 within the PWM cycle Tpwm2, to estimate the junction temperature TJ of the low side transistor TRdl.

The correlation information (IVTR(+)) and the correlation information (IVTR(−)) do not have to be two independent conversion tables but may be one common conversion table. Specifically, by properly correcting the input value (the inter-terminal voltage and the inter-terminal current) and the output value (junction temperature) of the common conversion table according to the current direction of the inter-terminal current, it can be treated actually as the two conversion tables.

<Schematic Operation of Control Device>

Figure 11A:
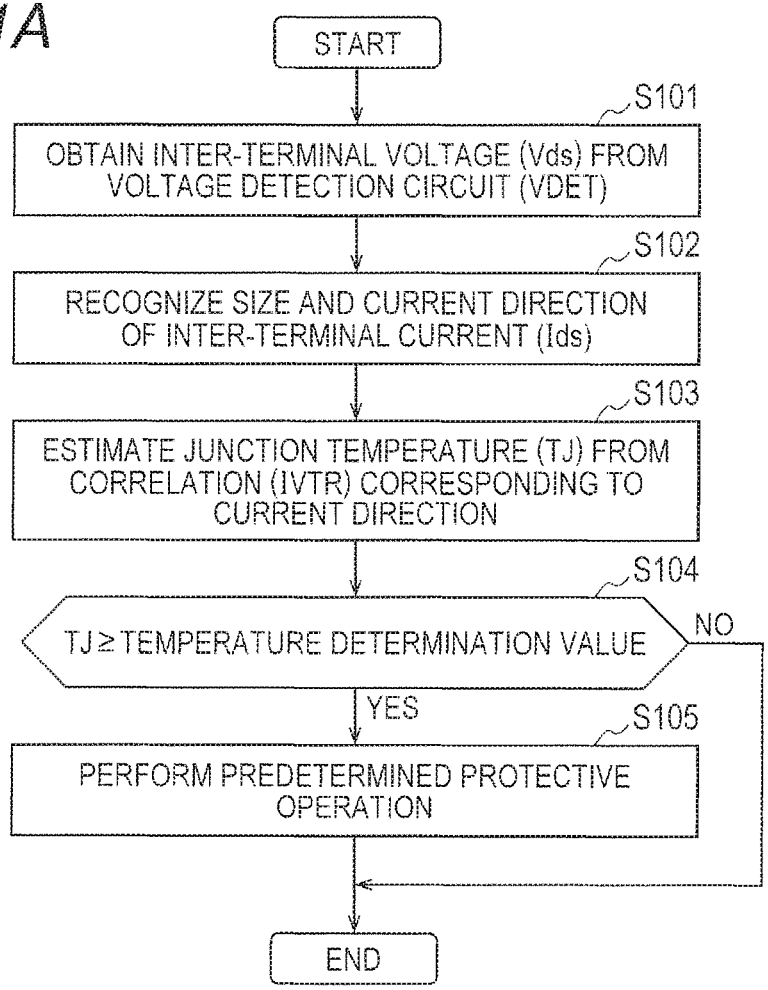
FIG. 11A is a flow chart showing one example of schematic processing contents of a control device in FIG. 10.
Figure 11B:
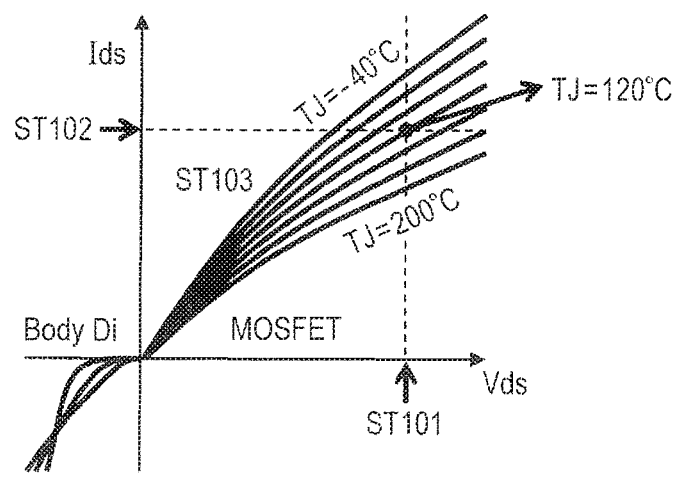
FIG. 11B is a supplementary view of FIG. 11A.

FIG. 11A is a flow chart showing one example of the schematic processing contents of the control device in FIG. 10, and FIG. 11B is a complementary view of FIG. 11A. In FIG. 11A, the control device MCU obtains the inter-terminal voltages Vds_H and Vds_L from the voltage detection circuits VDETh and VDETl (Step S101). Particularly, the control device MCU demodulates the received PWM signal PWMo to obtain the respective inter-terminal voltages Vds_H and Vds_L, as shown in FIG. 2.

The control device MCU recognizes the size and the current direction of the inter-terminal current Ids in each driving transistor (TRdh, TRdl), for example, from the control information of the load current IL obtained by the software for the motor control (Step S102). The control device MCU estimates the junction temperature TJ in every driving transistor (TRdh, TRdl), using the correlation information IVTR according to the current direction (Step S103).

In the example of FIG. 11B, the junction temperature TJ is estimated as 120° C. When the correlation information IVTR is mounted in a format of a conversion table, a relation among the inter-terminal voltage Vds, the inter-terminal current Ids, and the junction temperature TJ is kept, for example, as a discrete value, to reduce the capacity. In this case, the control device MCU estimates the junction temperature TJ by performing the complementary operation among the respective discrete values.

Next, the control device MCU determines whether or not the estimated junction temperature TJ arrives at a predetermined temperature determination value (Step S104). When it arrives at the temperature determination value, the control device MCU executes a predetermined protective operation (Step S105). Specifically, the control device MCU restricts, for example, the PWM duty (that is, the load current), hence to perform the protective operation of decreasing the junction temperature TJ.

<Details of Motor System>

Figure 12:
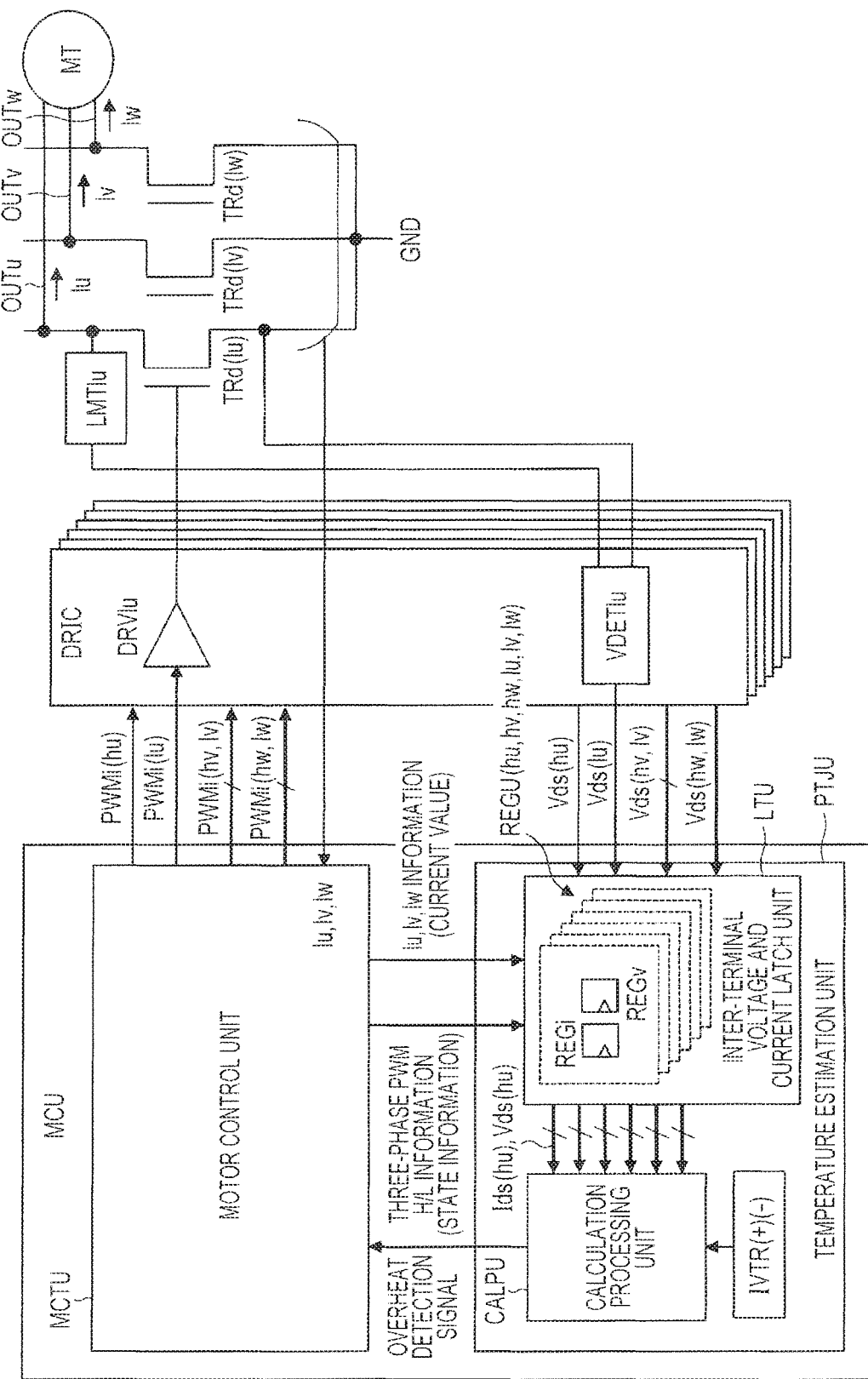
FIG. 12 is a schematic view showing a detailed structural example of the motor system shown in FIG. 10A.

FIG. 12 is a schematic view showing the detailed structural example of the motor system shown in FIG. 10A. The motor system of FIG. 12 includes a three-phase motor MT joined to the load driving terminals OUT(u, v, w) of three phases (u, v, and w phase) and the low side transistors TRd(lu, lv, lw) provided between the load driving terminals OUT(u, v, w) of the three phases and the ground power supply voltage GND. The low side transistors TRd(lu, lv, lw) of the three phases are a part of the three-phase inverter. Although the three-phase inverter is not illustrated, it actually has the high side transistors of the three phases as shown in FIG. 10A.

The motor system includes a plurality of driver devices DRIC each driving the three-phase low side transistor and high side transistor and one control device MCU. The driver devices DRIC may be properly formed into module. Further, in FIG. 12, as a part of the driver device DRIC, the driver DRVlu and the voltage detection circuit VDETlu of the low side transistor TRd(lu) are shown and further the voltage limiter LMTlu corresponding to the low side transistor TRd(lu) is shown.

The control device MCU is, for example, a microcontroller, including a motor control unit (load control unit) MCTU and a temperature estimation unit PTJU. The motor control unit MCTU and the temperature estimation unit PTJU are mounted, for example, according to the program processing using a processor. The motor control unit MCTU controls the on and off of the three-phase high side transistors and low side transistors with the complementary PWM signals, so that each value of the three-phase load currents Iu, Iv, and Iw flowing to the load driving terminals OUT(u, v, w) may be a current target value.

Specifically, the motor control unit MCTU detects the three-phase load currents Iu, Iv, and Iw through the current sensor ISEN. A current system using the current sensor ISEN includes, for example, a three-shunt system which detects three-phase currents using three resistance elements inserted into the three phases and a one-shunt system which detects the three-phase currents, using one resistance element inserted into the common connection path (GND path) of the three phases, according to a proper sampling timing of the analog and digital converter. Further, a system of inserting a current transformer into each phase is also taken as an example of the above current system. The motor control unit MCTU determines the PWM duty so that the detected three-phase currents may be the current target values, and reflecting the above, generates the PWM signals PWMi(hu, hv, hw) which control the high side transistors of the three phases and the PWM signals PWMi(lu, lv, lw) which control the low side transistors of the three phases. The PWM signals PWMi(hu, hv, hw) and the PWM signals PWMi(lu, lv, lw) become the complementary PWM signals. However, strictly speaking, each of them includes the dead time.

When generating the complementary PWM signal, the motor control unit MCTU recognizes the rotation angle of the motor MT, by including a hall element of the motor MT, or a rotation angle detection unit (or estimation unit) in the case of a position sensorless system. The motor control unit MCTU generates the PWM signal, for example, having the PWM duty sequentially shifting in a sine wave shape, by performing a timing control on the load current in synchronization with the rotation angle (in other words, a sine wave signal) of the motor MT. According to this control, the motor control unit MCTU recognizes the logic level information of the three-phase PWM signals in each PWM cycle and the information of the corresponding three-phase load currents Iu, Iv, and Iw (current values and current directions). In other words, the motor control unit MCTU always grasps the respective states S1 to S6 shown in FIG. 10B in every three phases.

The temperature estimation unit PTJU determines the current values and the current directions of the respective inter-terminal currents flowing in the three-phase high side transistors and low side transistors in every PWM cycle, based on the information of the three-phase load currents Iu, Iv, and Iw from the motor control unit MCTU and the logic level information of the complementary PWM signals. Depending on the determined current directions, the temperature estimation unit PTJU switches the two correlation information IVTR(+) and correlation information IVTR(−), as having been described in FIGS. 10A to 10C, hence to estimate each junction temperatures TJ of the three-phase high side transistors and low side transistors.

Specifically, the temperature estimation unit PTJU includes, for example, an inter-terminal voltage and current latch unit LTU, a calculation processing unit CALPU, and the correlation information IVTR(+) and IVTR(−). The inter-terminal voltage and current latch unit LTU sequentially obtains the logic level information of the complementary PWM signals (in other words, the state information in every three phases) and the information of the driving currents Iu, Iv, and Iw (current values), from the motor control unit MCTU. The inter-terminal voltage and current latch unit LTU obtains the inter-terminal voltages (drain voltages) Vds(hu, hv, hw) of the three-phase high side transistors and the inter-terminal voltages Vds(lu, lv, lw) of the three-phase low side transistors, from the driver device DRIC.

The inter-terminal voltage and current latch unit LTU includes three register units REGU(hu, hv, hw) corresponding to the three-phase high side transistors and three register units REGU(lu, lv, lw) corresponding to the three-phase low side transistors. Each register unit REGU includes a current value register REGi and a voltage value register REGv. The inter-terminal voltage and current latch unit LTU takes the information (current values) of the three-phase load currents Iu, Iv, and Iw into the current value registers REGi of the respective corresponding register units REGU, at a latch timing based on the state information in every three phases. Similarly, the inter-terminal voltage and current latch unit LTU takes the inter-terminal voltages of the three-phase high side transistors and low side transistors, into the voltage value registers REGv of the respective corresponding registers unit REGU, at the latch timing based on the state information in every three phases.

The load current Iu of the u-phase as the load current IL shown in FIG. 10C and the period when the motor control unit MCTU controls the PWM cycle Tpwm1 are taken as a concrete example. During the above period, the inter-terminal voltage and current latch unit LTU takes the load current Iu into the current value register REGi of the register unit REGU(hu) and takes the inter-terminal voltage Vds(hu) of the u-phase high side transistor into the voltage value register REGv of the register unit REGU(hu), at a timing of the state ST1. Further, the inter-terminal voltage and current latch unit LTU takes the inverted current value (−Iu) of the load current Iu into the current value register REGi of the register unit REGU(lu) and takes the inter-terminal voltage Vds(lu) of the u-phase low side transistor into the voltage value register REGv of the register unit REGU(lu), at a timing of the state ST3.

The calculation processing unit CALPU receives, for example, the inter-terminal voltages and the inter-terminal currents of the three-phase high side transistors held in the three register units REGU(hu, hv, hw) and the inter-terminal voltages and the inter-terminal currents of the three-phase low side transistors held in the three register units REGU(lu, lv, lw), in every PWM cycle. The calculation processing unit CALPU switches the correlation information IVTR(+) and IVTR(−) to be referred to, as having been described in FIG. 10, for example, based on the polarity of the taken inter-terminal currents (or inter-terminal voltages).

Then, the calculation processing unit CALPU estimates the junction temperatures TJ of the respective driving transistors, based on the inter-terminal voltages and the inter-terminal currents of the respective driving transistors and the corresponding correlation information. In the case of the concrete example of the above mentioned PWM cycle Tpwm1, the calculation processing unit CALPU uses the correlation information IVTR(+) for the u-phase high side transistor and uses the correlation information IVTR(−) for the u-phase low side transistor.

Further, when the junction temperature TJ exceeds a predetermined temperature determination value in one of the driving transistors, the calculation processing unit CALPU outputs an overheat detection signal to the motor control unit MCTU. Upon receipt of this, the motor control unit MCTU performs the protective operation of fixing the respective driving transistors at off through the PWM signals, restricting the load currents, or the like, then to continue the operation.

<Main Effects of Second Embodiment>

As mentioned above, the same effects as the various effects having been described in the first embodiment can be obtained by using the power conversion device (motor system) according to the second embodiment. Further, by switching the correlation information IVTR to use, according to the direction of the inter-terminal current Ids, the junction temperature TJ can be estimated at a higher accuracy than in the case of the first embodiment. Further, in the actual operation, the estimation period of the junction temperature TJ in every driving transistor can be properly determined.

Third Embodiment

<Structure of Driver Device (Semiconductor Device)>

Figure 13:
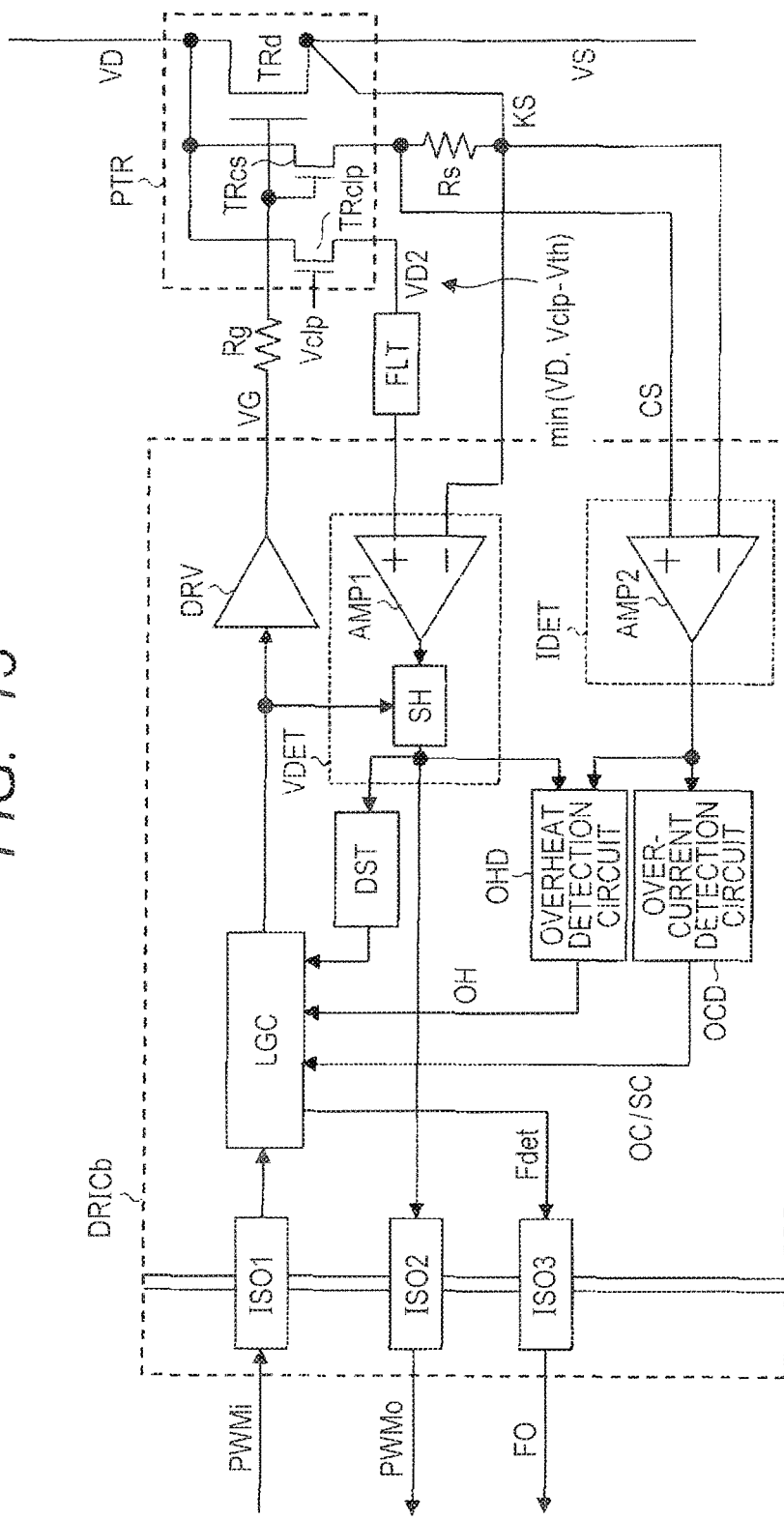
FIG. 13 is a schematic view showing a structural example of the main portion of a semiconductor device according to a third embodiment of the invention.

FIG. 13 is a schematic view showing a structural example of the main portion of a semiconductor device according to a third embodiment of the invention. A driver device (semiconductor device) DRICb shown in FIG. 13 is different from the driver device DRIC shown in FIG. 2 in the following points. As a first different point, the driver device DRICb includes, for example, a control logic circuit LGC including the AND gate AD1 and the OR gate OR1 of FIG. 2.

As a second different point, the driver device DRICb includes a current detection circuit IDET and an over-current detection circuit OCD. The current detection circuit IDET detects the inter-terminal current Ids between the source terminal and the drain terminal during the on-period of the power transistor PTR, through a current detecting resistance element Rs. Specifically, the current detection circuit IDET includes an amplifier circuit AMP2 which detects a both-end voltage of the resistance element Rs and amplifies the above with a predetermined gain. The over-current detection circuit OCD corresponds to the comparator CMP2 of FIG. 2 and determines whether or not there is an over-current or a short-circuit in the power transistor PTR, by comparison between the inter-terminal current Ids detected by the current detection circuit IDET (actually, the voltage value in proportion to this) and a predetermined current determination value (actually, the voltage determination value Vcp2 like FIG. 2). Although it is simplified in FIG. 2, more specifically, the driver device includes this type of the current detection circuit IDET also in the structural example in FIG. 2.

As a third different point, the driver device DRICb includes an overheat detection circuit OHD which detects whether or not there is overheat in the power transistor PTR. The overheat detection circuit OHD estimates the junction temperature TJ of the power transistor PTR, although the details will be described later, and when the above temperature exceeds a predetermined temperature determination value, the above unit outputs an overheat detection signal OH. When receiving the overheat detection signal OH from the overheat detection circuit OHD and the over-current detection signal OC or the short-circuit current detection signal SC from the over-current detection circuit OCD, and the detection signal from the DESAT detection circuit DST, the control logic circuit LGC performs a predetermined protective operation through the driver DRV. For example, when receiving the overheat detection signal OH, the control logic circuit LGC controls the power transistor PTR to be turned off through the driver DRV.

Here, by using the above mentioned methods of the first and the second embodiments, it is possible to estimate the junction temperature TJ, using the control device MCU and to perform the protective operation on the power transistor PTR according to the result. Especially, for the use requiring a high safety, typified by the use in a vehicle, for example, a fail-safe function to cope with the occurrence of a failure in the control device MCU is preferably provided. Here, the overheat detection circuit OHD is provided within the driver device DRIC, to perform the overheat protection also on the driver device DRIC.

When using both the protective operation by the control device MCU and the protective operation by the driver device DRIC, for example, the following method can be used. The control device MCU performs a predetermined protective operation of restricting the load current, not to arrive at the upper limit in the power transistor PTR, using the temperature determination value lower than the upper limit in the operation temperature range of the power transistor PTR. On the other hand, when the power transistor PTR arrives at the upper limit, the driver device DRIC performs a predetermined protective operation, using a temperature determination value higher than the temperature determination value of the control device MCU, for example, similar to or a little higher than the above upper limit. Thus, when the protective operation by the driver device DRIC is regarded as the fail-safe function of the protective operation by the control device MCU, there is no problem if the temperature estimation accuracy by the driver device DRIC is lower than that by the control device MCU.

Here, the driver device DRIC is usually formed in a structure of adding a simple digital circuit to a main analog circuit. Further, it is not easy for the driver device DRIC to grasp the state information as shown in FIG. 10B. Therefore, when the driver device DRIC estimates the junction temperature TJ, it is hard for the driver device DRIC to be provided with the same temperature estimation unit PTJU as in the case of the control device MCU.

Figure 14A:
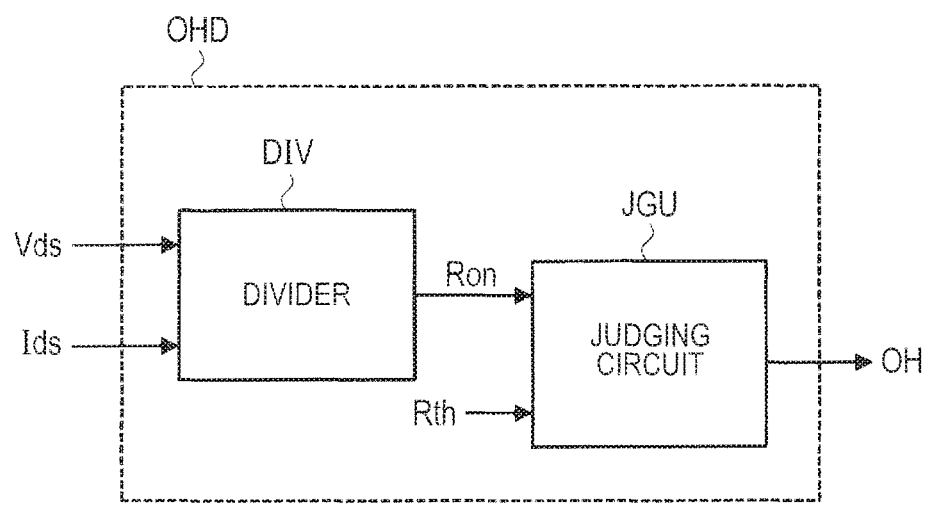
FIG. 14A is a schematic view showing a structural example of an overheat detection circuit in FIG. 13.
Figure 14B:
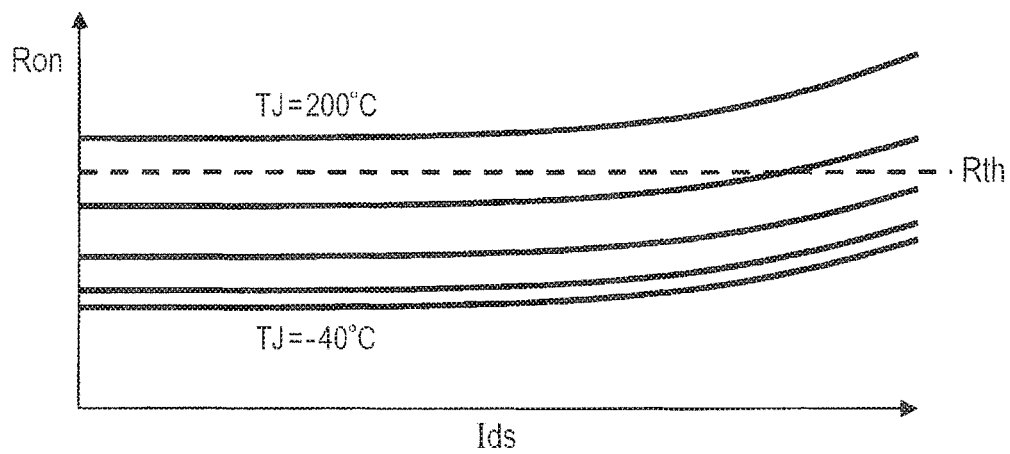
FIG. 14B is a supplementary view showing the operation example of FIG. 14A.

Then, the overheat detection circuit OHD estimates the junction temperature TJ, using the method as shown in FIGS. 14A and 14B. FIG. 14A is a schematic view showing a structural example of the overheat detection circuit in FIG. 13 and FIG. 14B is a complementary view showing the operation example of FIG. 14A. The overheat detection circuit OHD shown in FIG. 14A includes a divider (temperature calculation circuit) DIV and a judging circuit JGU.

The divider DIV calculates the on-resistance Ron of the power transistor PTR, based on the inter-terminal voltage Vds detected by the voltage detection circuit VDET and the inter-terminal current Ids detected by the current detection circuit IDET. Specifically, the divider DIV estimates the junction temperature TJ by calculating "Ron=Vds/Ids". The judging circuit JGU detects whether or not there is overheat, by comparison between the on-resistance Ron calculated by the divider DIV and a predetermined resistance determination value Rth, and when there is the overheat, the above circuit outputs the overheat detection signal OH. As for the current detection circuit IDET, the structure used in the over-current detection circuit OCD can be used as it is and there is no need to provide something additionally.

The on-resistance Ron has the temperature dependency as shown in FIG. 14B. When a proper resistance determination value Rth is set, overheat detection is enabled. However, the on-resistance Ron has some dependency also on the inter-terminal current Ids; therefore, when a fixed level of the resistance determination value Rth is used, the on-resistance Ron easily becomes more than the resistance determination value Rth in the case of the large inter-terminal current Ids. In other words, when the inter-terminal current Ids is large, it is determined that there is overheat even when the junction temperature TJ is lower than originally set. This works to enhance the safety further; therefore, it does not matter if the resistance determination value Rth is of a fixed level.

The divider DIV can be formed in an analog circuit or a digital circuit. The overheat detection circuit OHD cannot perform the correct detection operation during the off-period of the PWM signal PWMi (power transistor PTR). Therefore, the control logic circuit LGC is formed to receive the overheat detection signal OH, for example, during the on-period of the PWM signal PWMi (power transistor PTR).

Figure 15:
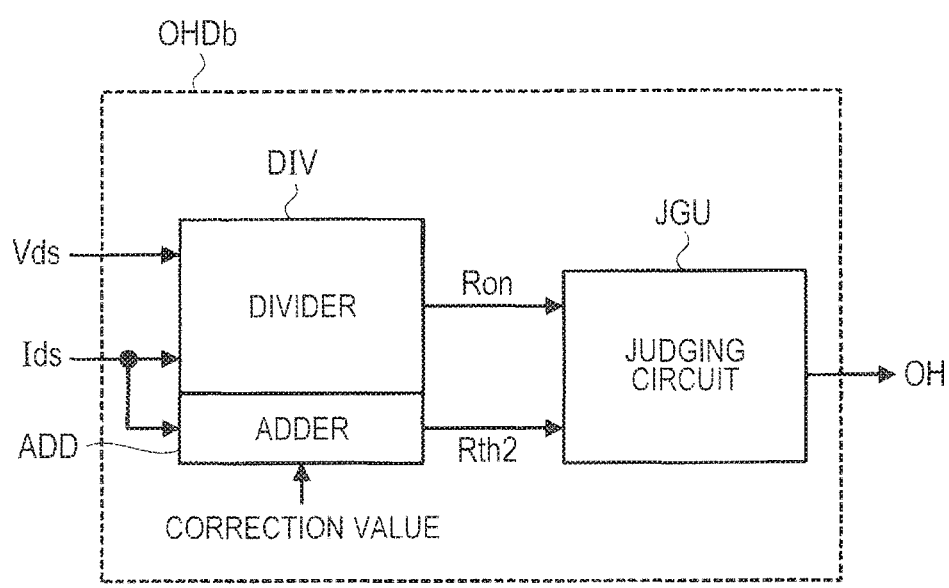
FIG. 15 is a schematic view showing another structural example of the overheat detection circuit in FIG. 13.

FIG. 15 is a schematic view showing another structural example of the overheat detection circuit in FIG. 13. As mentioned above, in the case of the fixed level of the resistance determination value Rth, when the inter-terminal current Ids is large, the overheat protection works in a safer direction; depending on the case, however, the overheat protection may be excessive disadvantageously. Then, the overheat detection circuit OHDb of FIG. 15 further includes an adder (determination value correction circuit) ADD, in addition to the structural example of FIG. 14A. The adder ADD corrects the resistance determination value Rth2, according to the size of the inter-terminal current Ids. For example, the adder ADD may output the result obtained by adding the correction value in proportion to the inter-terminal current Ids to the fixed level of the resistance determination value (Rth1) as a resistance determination value Rth2, based on the characteristic curve shown in FIG. 14B, when the inter-terminal current Ids exceeds a certain reference value.

<Main Effects of Third Embodiment>

As mentioned above, by using the semiconductor device according to the third embodiment, the same effects as the various effects having been described in the first embodiment can be obtained. Further, the overheat protection is performed also on the driver device DRIC, which can further enhance the safety of the power conversion device and further a system including the same device.

Fourth Embodiment

<Structure of Motor System>

Figure 16:
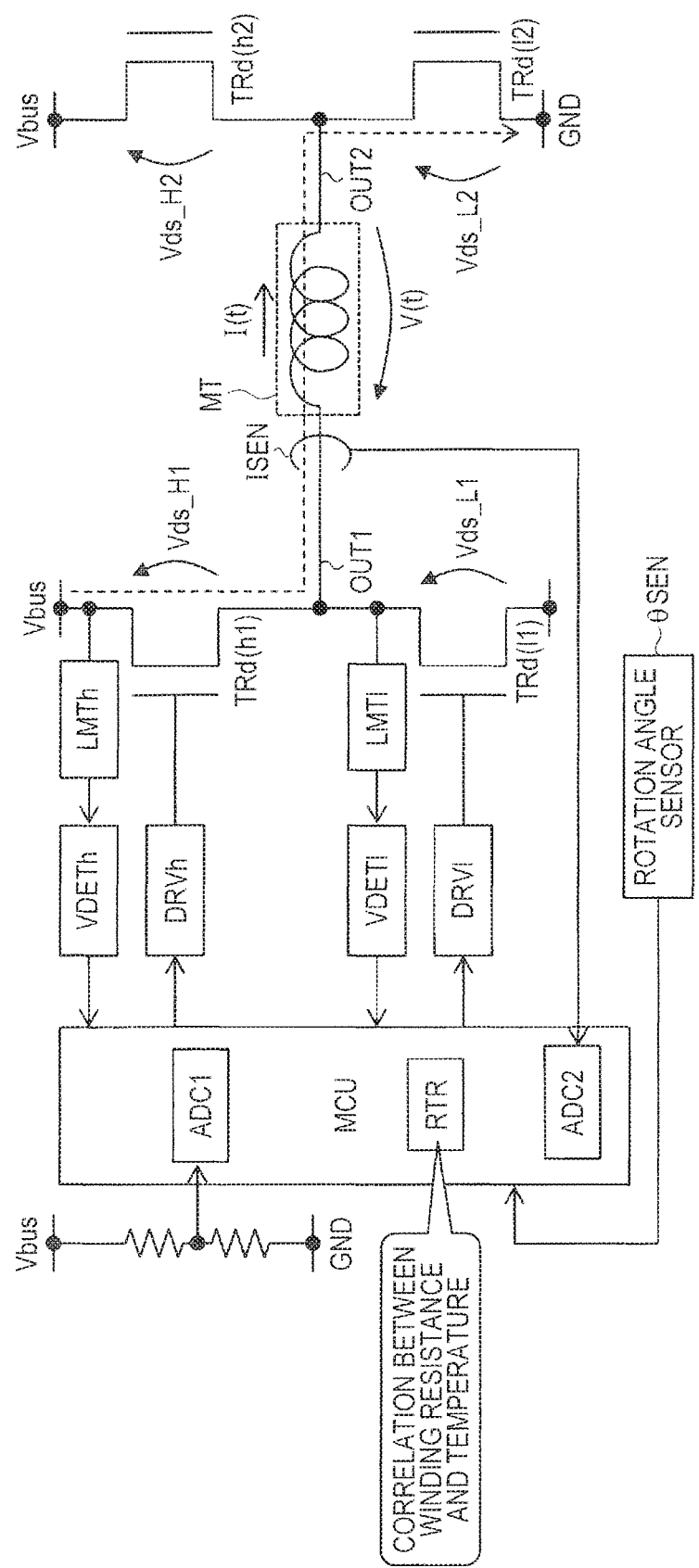
FIG. 16 is a schematic view showing a structural example of the main portion of a motor system according to a fourth embodiment of the invention.

FIG. 16 is a schematic view showing a structural example of the main portion of a motor system according to a fourth embodiment of the invention. The motor system shown in FIG. 16 includes a motor MT joined between the load driving terminals OUT1 and OUT2, the high side transistors TRd(h1) and TRd(h2), and the low side transistors TRd(l1) and TRd(l2). The high side transistors TRd(h1) and TRd(h2) are respectively provided between the power supply voltage Vbus and the load driving terminal OUT1 and between the power supply voltage Vbus and the load driving terminal OUT2. The low side transistors TRd(l1) and TRd(l2) are respectively provided between the ground power supply voltage GND and the load driving terminal OUT1 and between the ground power supply voltage GND and the load driving terminal OUT2.

The motor system includes voltage limiters LMTh and LMTl, voltage detection circuits VDETh and VDETl, drivers DRVh and DRVl, a control device MCU, a current sensor ISEN, and a rotation angle sensor OSEN. The voltage limiter LMTh, the voltage detection circuit VDETh, and the driver DRVh are provided correspondingly to the high side transistor TRd(h1) and the voltage limiter LMTl, the voltage detection circuit VDETl, and the driver DRVl are provided correspondingly to the low side transistor TRd(l1). Although they are not shown, the high side transistor TRd(h2) and the low side transistor TRd(l2) have the same structure.

The current sensor ISEN detects the current I(t) of the motor MT and the rotation angle sensor OSEN detects the rotation angle of the motor MT. The control device MCU previously holds the correlation information RTR between a winding resistance and a winding temperature of the motor MT. The control device MCU recognizes the size of the power supply voltage Vbus, using the analog digital converter ADC1 and recognizes the size of the current I(t) of the motor MT by the current sensor ISEN, using the analog digital converter ADC2. Further, the control device MCU recognizes the rotation speed of the motor MT, based on the detection result of the rotation angle sensor OSEN.

Figure 17A:
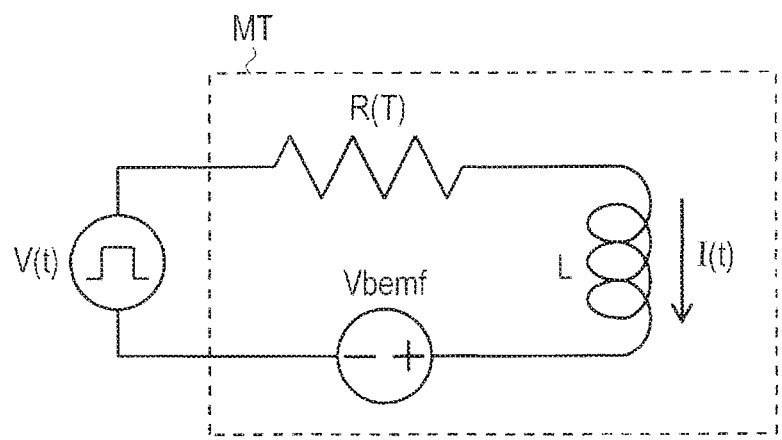
FIG. 17A is an equivalent circuit of a motor in FIG. 16
Figure 17B:
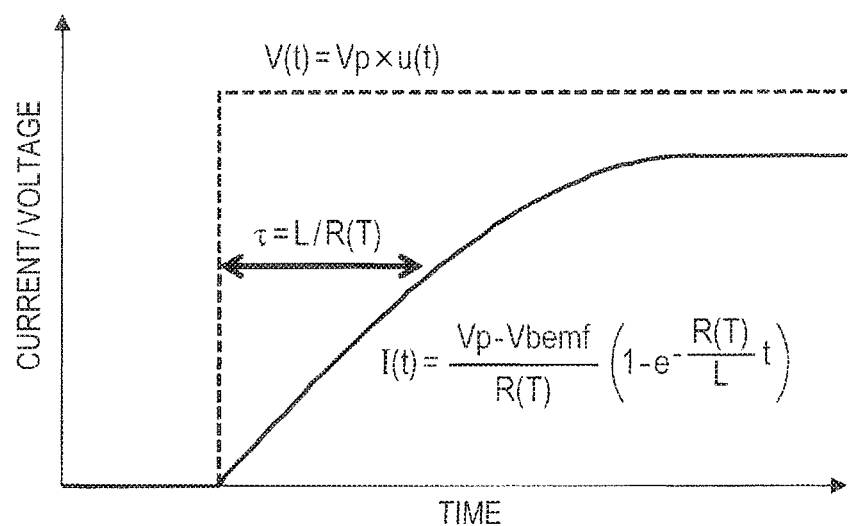
FIG. 17B is a wave form chart showing the operation example of the equivalent circuit of FIG. 17A.

FIG. 17A is an equivalent circuit of the motor in FIG. 16 and FIG. 17B is a wave form chart showing the operation example of the equivalent circuit in FIG. 17A. In the motor system as shown in FIG. 16, the temperature of the motor MT is required to be estimated in some cases, in addition to the junction temperature TJ of the power transistor. The motor MT is modeled with the applied voltage V(t), the winding inductance L, the winding resistance R(t), and the counter electromotive voltage Vbemf, as shown in FIG. 17A.

Here, the winding resistance R(t) becomes unstable because it fluctuates at the temperature T. When the winding inductance L, the counter electromotive voltage Vbemf, the applied voltage V(t), and the current I(t) of the motor MT are known, the winding resistance R(t) can be calculated. The winding inductance L can be previously defined as a fixed value without the temperature dependency. The current I(t) can be detected by the current sensor ISEN. The counter electromotive voltage Vbemf can be calculated, for example, through the calculation within the motor control software (rotation speed×counter electromotive voltage constant).

Accordingly, the control device MCU calculates the winding resistance R(t) if the applied voltage V(t) is given. Further, the control device MCU can estimate the winding temperature from the winding resistance R(t), by previously holding the correlation information RTR (specifically, numerical expression and conversion table) between the winding resistance R(t) and the winding temperature, as shown in FIG. 16. To enhance this estimation accuracy, a high accuracy of the applied voltage V(t) is required. Specifically, when the current I(t) flows in the current channel as shown in FIG. 16, the applied voltage V(t) becomes a value obtained by subtracting a voltage drop of the high side transistor TRd(h1) and the low side transistor TRd(l2) from the power supply voltage Vbus. In the structural example of FIG. 16, the voltage detection circuits VDETh and VDETl can detect this voltage drop, hence to estimate the winding temperature at a high accuracy.

FIG. 17B shows the response characteristics of the current I(t) corresponding to the applied voltage V(t). The current I(t) varies as shown in the expression (2), with respect to the step-shaped applied voltage V(t) (=Vp×u(t)) accompanying the PWM signal. As the result, the time constant τ becomes "L/R(T)".

$$I(t)=\{(Vp-Vbemf)/R(T)\}\times(1-\exp(-(R(T)/L)\times t)) \qquad (2)$$

<Operation of Control Device>

Figure 18:
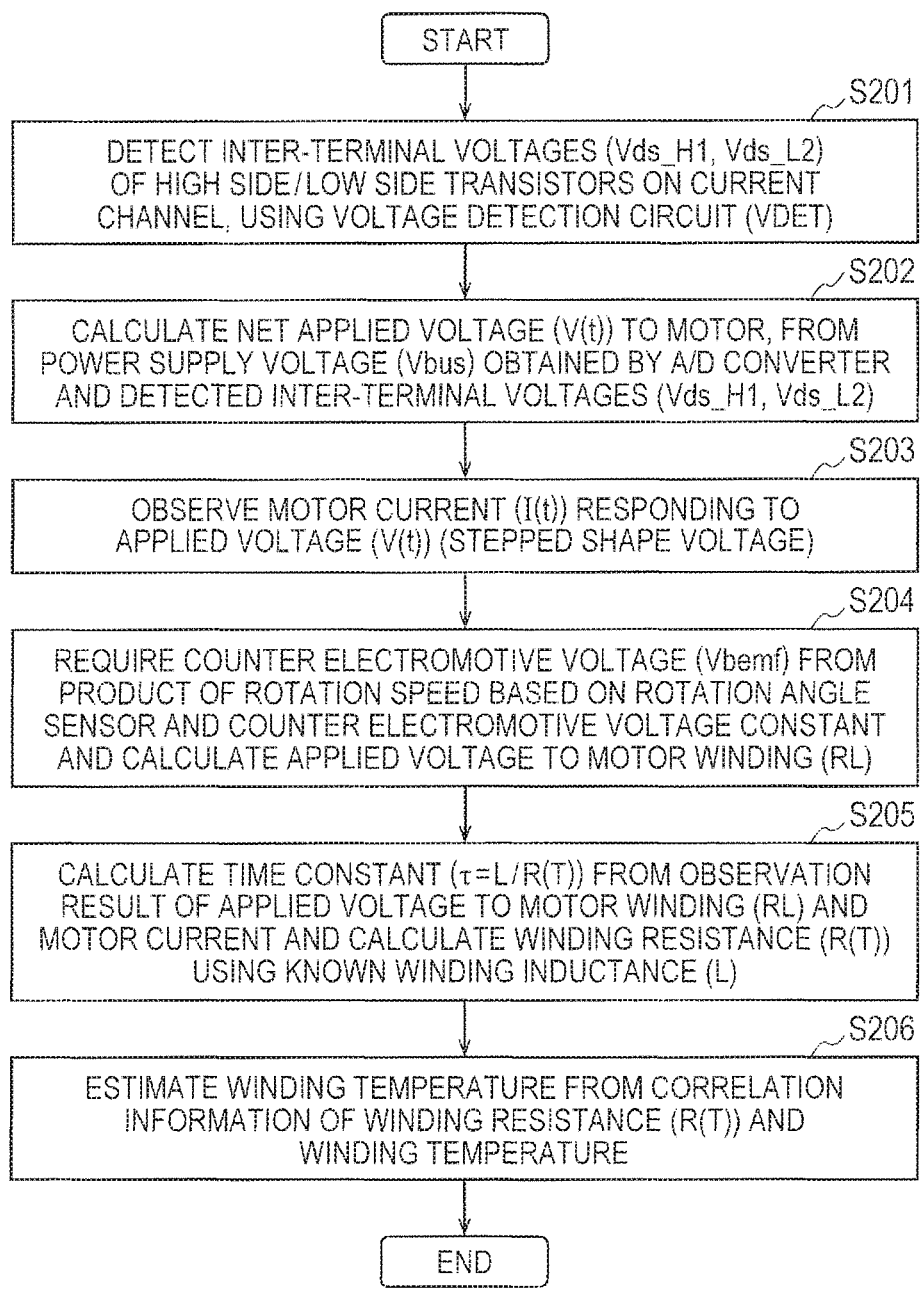
FIG. 18 is a flow chart showing one example of the processing contents of a control device in FIG. 16.

FIG. 18 is a flow chart showing one example of the processing contents of the control device in FIG. 16. In FIG. 18, the control device MCU obtains the inter-terminal voltage Vds_H1 of the high side transistor TRd(h1) and the inter-terminal voltage Vds_L2 of the low side transistor TRd(h2) from the corresponding voltage detection circuits VDETh and VDETl (Step S201). Further, the control device MCU obtains a potential difference between the power supply voltage Vbus and the ground power supply voltage GND, using the analog digital converter ADC1. By using this information, the control device MCU calculates the net applied voltage V(t) (=Vbus−(Vds_H1+Vds_L2)) to the motor MT (Step S202).

Then, the control device MCU observes the current I(t) of the motor MT in response to the applied voltage V(t), using the current sensor ISEN (Step S203). Continuously, the control device MCU calculates the counter electromotive voltage Vbemf according to the rotation speed based on the rotation angle sensor OSEN and the predetermined counter electromotive voltage constant and calculates the applied voltage (=V(t)−Vbemf) to the winding (RL) of the motor MT, based on the counter electromotive voltage Vbemf and the applied voltage V(t) to the motor (Step S204).

Next, the control device MCU calculates the winding resistance R(t) of the motor MT (Step S205), based on the applied voltage to the winding (RL) of the motor MT and the observation result of the current I(t) by the motor MT in Step S203. More specifically, the control device MCU calculates the time constant τ(=L/R(t)) indicated in FIG. 17B and calculates the winding resistance R(t), using the known winding inductance L. Then, the control device MCU estimates the winding temperature from the winding resistance R(t), based on the correlation information RTR (Step S206).

<Main Effect of Fourth Embodiment>

As mentioned above, using the motor system according to the fourth embodiment, the applied voltage to the motor MT can be calculated at a high accuracy, hence to estimate the winding resistance correctly and to estimate the winding temperature from the temperature dependency (correlation information RTR) of the winding resistance accurately. As the result, the temperature control of the motor MT and the overheat protection are possible.

Fifth Embodiment

<Manufacturing Method of Power Conversion Device>

Figure 19:
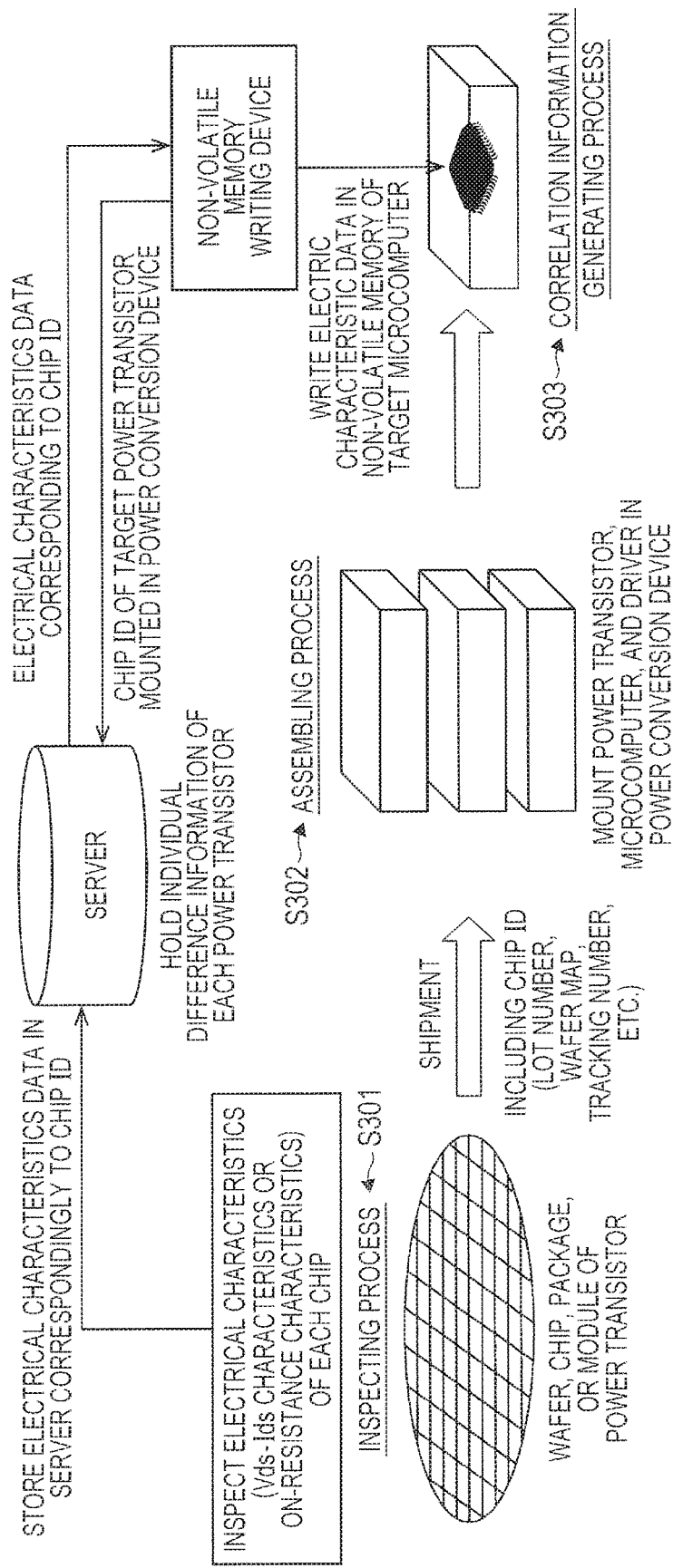
FIG. 19 is a schematic view showing one example of the processing contents, in a manufacturing method of a power conversion device according to a fifth embodiment of the invention.

FIG. 19 is a schematic view showing one example of the processing contents in a manufacturing method of a power conversion device according to a fifth embodiment of the invention. For example, in the method of the first embodiment, the junction temperature TJ is estimated based on the correlation information IVTR. Here, to do an accurate estimation, the correlation information IVTR has to be accurate. On the other hand, in the actual power transistor, variation can occur in the electrical characteristics according to the manufacturing dispersion. Therefore, it is difficult to define the accurate correlation information IVTR in common among a plurality of the power transistors.

Then, a manufacturing method as shown in FIG. 19 is useful. At first, in the inspection process of Step S301 in FIG. 19, various types of inspection devices (a wafer test device, a package test device, and the like) inspect the electrical characteristics of the power transistors PTR (for example, the inter-terminal voltage Vds and inter-terminal current Ids characteristics and the on-resistance characteristics). The various inspection devices (or their control terminals and the like) store the data of the electrical characteristics as the inspection results in correspondence with the identifiers of the power transistors PTR, in a server. The identifier includes lot number, wafer map, tracking number, and the like.

Then, the power transistors PTR are shipped from a manufacturing maker to an assembling maker. In the assembling process in Step S302, the assembling maker mounts various types of parts (for example, each part shown in FIG. 1) including the power transistor PTR, the driver device DRIC, and the control device MCU in the power supply device, using a predetermined assembly device. Here, for example, a combination of the power transistor PTR and the control device MCU (for example, the microcontroller) is freely determined.

Continuously, in the correlation information generating process in Step S303, a predetermined information processing terminal obtains the data of the electrical characteristics of the power transistor PTR to be mounted in the power supply device, from the server, with the identifier of the power transistor PTR as a search key. A non-volatile memory writing device defines the correlation information IVTR of the control device MCU mounted in the same power supply device as the above power transistor PTR, based on the date of the electrical characteristics obtained from the server. Specifically, it may be, for example, a method of defining the correlation information IVTR from scratch or a method of holding the common correlation information IVTR previously in the control device MCU and adding various kinds of correction parameters to the above, based on the obtained data. For example, when the control device MCU is a microcontroller, the correlation information IVTR is written into a non-volatile memory such as a flash memory. The non-volatile memory writing device also writes various kinds of user programs and user data into the non-volatile memory, in addition to the correlation information IVTR.

<Main Effects of Fifth Embodiment>

As mentioned above, the same effects as the various effects having been described in the first embodiment can be obtained in the manufacturing method of the power conversion device according to the fifth embodiment. Further, the correlation information IVTR customized for every power transistor can be used; therefore, even when the manufacturing variation occurs in the power transistor, it is possible to estimate the junction temperature TJ at a high accuracy.

As set forth hereinabove, although the invention made by the inventors et al. has been specifically described based on the embodiments, the invention is not restricted to the embodiments but various modifications without departing from its spirit are possible. For example, the above mentioned embodiments have been described in detail to describe the invention clearly and the invention is not restricted to the structure including all the components having been described. A part of the structure according one embodiment can be replaced with the structure according to the other embodiment and the structure of one embodiment can be added to the structure of the other embodiment. Further, the other structure can be added or deleted or replaced, as for a part of the structure of each embodiment.

APPENDIXES (1) A semiconductor device including:
a semiconductor chip where a plurality of unit transistors each having a first node, a second node, and a control input node are provided and a driving transistor and a clamping transistor are provided according to the allocation of the unit transistors;
a control input terminal joined to the control input node of the driving transistor;
a first terminal joined to the first node of the driving transistor;
a second terminal joined to the second nodes of the driving transistor and the clamping transistor in common;
a clamp input terminal joined to the control input node of the clamping transistor; and
a voltage sensing terminal joined to the first node of the clamping transistor,
in which the number of the unit transistors forming the clamping transistor is less than the number of the unit transistors forming the driving transistor.

(2) The semiconductor device according to the above (1),
the semiconductor chip further including a current sensing transistor according to the allocation of the unit transistors,
the semiconductor device further including a current sensing terminal joined to the first node of the current sensing transistor,
in which the control input node of the current sensing transistor is joined to the control input terminal,
the second node of the current sensing transistor is joined to the second terminal, and the number of the unit transistors forming the current sensing transistor is less than the number of the unit transistors forming the driving transistor.

(3) The semiconductor device according to the above (2), further including a Kelvin terminal joined to the first node of the driving transistor.

(4) The semiconductor device according to the above (2), in which the unit transistors are MOSFETs of SiC structure.

(5) A semiconductor device including:

a semiconductor chip where a plurality of unit transistors each having a first node, a second node, and a control input node are provided and a driving transistor, a current sensing transistor, and a clamping transistor are provided according to the allocation of the unit transistors;

a control input terminal joined to the control input nodes of the driving transistor and the current sensing transistor;

a first terminal joined to the first node of the driving transistor;

a second terminal joined to the second nodes of the driving transistor, the current sensing transistor, and the clamping transistor in common;

a current sensing terminal joined to the first node of the current sensing transistor; and a voltage sensing terminal joined to the first node of the clamping transistor, in which the number of the unit transistors forming the current sensing transistor is less than the number of the unit transistors forming the driving transistor, and the number of the unit transistors forming the clamping transistor is less than the number of the unit transistors forming the driving transistor.

(6) The semiconductor device according to the above (5), further including a clamp input terminal joined to the control input node of the clamping transistor.

(7) The semiconductor device according to the above (5), in which the control input node of the clamping transistor is joined to the control input terminal.

(8) The semiconductor device according to the above (5), further including a Kelvin terminal joined to the first node of the driving transistor.

(9) A motor system including:

a motor joined between a first load driving terminal and a second load driving terminal;

a high side transistor provided between a power supply voltage at a side of high potential and the first load driving terminal;

a low side transistor provided between the second load driving terminal and a power supply voltage at a side of low potential;

a current sensor that detects a current of the motor;

a control device that controls on and off of the high side transistor and the low side transistor and previously holds correlation information between a winding resistance and a winding temperature of the motor;

a high side voltage detection circuit that detects an inter-terminal voltage between a first terminal and a second terminal of the high side transistor, during the on-period of the high side transistor; and a low side voltage detection circuit that detects an inter-terminal voltage between a first terminal and a second terminal of the low side transistor, during the on-period of the low side transistor, in which the control device performs first processing of calculating an applied voltage to the motor, based on a potential difference between the power supply voltages at the side of high potential and at the side of low potential, the inter-terminal voltage detected by the high side voltage detection circuit, and the inter-terminal voltage detected by the low side voltage detection circuit, second processing of observing a current of the motor in response to the applied voltage to the motor, using the current sensor, third processing of calculating a counter electromotive voltage of the motor and calculating an applied voltage to a winding of the motor based on the counter electromotive voltage and the applied voltage to the motor, fourth processing of calculating a winding resistance of the motor, based on the applied voltage to the winding of the motor and the observation result of the current of the motor, and fifth processing of estimating the winding temperature from the winding resistance, based on the correlation information.

(10) The motor system according to the above (9), in which the control device calculates a time constant of the current of the motor responding to the applied voltage to the motor and calculates the winding resistance, based on the time constant and a known winding inductance in the motor, in the third processing.

(11) A method of manufacturing a power conversion device including a power transistor having a control input terminal, a first terminal, and a second terminal, which supplies electric power to a predetermined load through the first terminal and the second terminal, a control device, formed by other parts different from those of the power transistor, including a temperature estimation unit, which controls on and off of the power transistor, and a voltage detection circuit that detects an inter-terminal voltage of the first terminal and the second terminal during the on-period of the power transistor, the temperature estimation unit previously holding correlation information between the inter-terminal voltage and inter-terminal current of the first terminal and second terminal and a junction temperature and estimating the junction temperature, based on the inter-terminal voltage detected by the voltage detection circuit, a known inter-terminal current, and the correlation information, the above manufacturing method including:

an inspecting process of inspecting electrical characteristics of the power transistor and storing the electrical characteristics data as the inspection result in a server correspondingly to an identifier of the power transistor;

an assembling process of mounting the power transistor, the control device, and the voltage detection circuit in a power supply device; and a correlation information generating process of obtaining the electrical characteristics data of the power transistor mounted in the power supply device from the server with the identifier of the power transistor as a search key and defining the correlation information of the control device mounted in the same power supply device as the power transistor, based on the obtained electrical characteristics data.

(12) The manufacturing method according to the above (11), in which the control device is a microcontroller with a non-volatile memory mounted and holds the correlation information in the non-volatile memory.

What is claimed is:

1. A power conversion device comprising:
    a power transistor including a control input terminal, a first terminal, and a second terminal, which supplies electric power to a predetermined load through the first terminal and the second terminal;
    a driver that drives the control input terminal;
    a control device including a temperature estimation unit, which controls on and off of the power transistor through the driver;
    a voltage detection circuit that detects an inter-terminal voltage of the first terminal and the second terminal during an on-period of the power transistor; and
    a voltage limiter that transmits the inter-terminal voltage to the voltage detection circuit with an upper limit thereof restricted,
    wherein the temperature estimation unit previously holds correlation information between the inter-terminal voltage and inter-terminal current of the first terminal and second terminal and a junction temperature and estimates the junction temperature, based on the inter-terminal voltage obtained from the voltage detection circuit, a known inter-terminal current, and the correlation information,
    wherein the voltage limiter includes a clamping transistor in which the second terminal is coupled to a second node and a clamp voltage of defining the upper limit is applied to a control input node,
    wherein the power transistor is formed by some of a plurality of unit transistors formed in one semiconductor chip,
    wherein the clamping transistor is formed by others of the unit transistors, using the same semiconductor chip as the power transistor, and
    wherein the number of the unit transistors forming the clamping transistor is less than the number of the unit transistors forming the power transistors.

2. The device according to claim 1, further comprising a DESAT detection circuit that determines whether or not there is non-saturation in the power transistor, by comparison between the inter-terminal voltage detected by the voltage detection circuit and a predetermined voltage determination value.

3. The device according to claim 1, wherein the voltage detection circuit includes a sampling holding circuit that, upon receipt of an on and off control signal of the power transistor from the control device, samples the inter-terminal voltage during the on-period of the power transistor and holds the above sampling value during an off-period of the power transistor.

4. The device according to claim 3, wherein upon receipt of a shift to an on level of the on and off control signal, the sampling holding circuit starts a sampling operation after a predetermined delay.

5. The device according to claim 1, wherein the temperature estimation unit holds two types of the correlation information corresponding to current direction of the inter-terminal current and switches the two correlation information according to the current direction of the known inter-terminal current, hence to estimate the junction temperature.

6. The device according to claim 5, further comprising:
    a high side transistor as one of the power transistor, provided between a power supply voltage at a side of high potential and a load driving terminal; and
    a low side transistor as the other of the power transistor, provided between the load driving terminal and a power supply voltage at a side of low potential,
    wherein the control device further includes a load control unit that controls the on and off of the high side transistor and the low side transistor with a complementary PWM signal so that a load current flowing to the load driving terminal becomes a current target value, and
    wherein the temperature estimation unit determines a current value and current direction of the inter-terminal current flowing to the high side transistor or a current value and current direction of the inter-terminal current flowing to the low side transistor in every PWM cycle, based on information of the load current from the load control unit and logic level information of the complementary PWM signal, and switches the two types of the correlation information according to the determined current direction, hence to estimate the junction temperature of the high side transistor and the junction temperature of the low side transistor.

7. The device according to claim 1, wherein the temperature estimation unit includes a weighted average filter that weights the plural junction temperatures estimated at each time with a size of the corresponding inter-terminal voltage or inter-terminal current and then averages the junction temperatures.

8. A power conversion device comprising:
    a power transistor including a control input terminal, a first terminal, and a second terminal, which supplies electric power to a predetermined load through the first terminal and the second terminal;
    a driver device; and
    a control device including a temperature estimation unit, which controls on and off of the power transistor through the driver device,
    wherein the driver device includes
        a driver that drives the control input terminal,
        a voltage detection circuit that detects an inter-terminal voltage of the first terminal and the second terminal during an on-period of the power transistor,
        a current detection circuit that detects an inter-terminal current of the first terminal and the second terminal during the on-period of the power transistor, and
        a temperature calculation circuit that calculates an on-resistance of the power transistor, based on the inter-terminal voltage detected by the voltage detection circuit and the inter-terminal current detected by the current detection circuit, hence to estimate a junction temperature,
    wherein the temperature estimation unit previously holds correlation information between the inter-terminal voltage and inter-terminal current of the first terminal and second terminal and the junction temperature, and estimates the junction temperature, based on the inter-terminal voltage obtained from the voltage detection circuit, a known inter-terminal current, and the correlation information
    wherein the power transistor includes:
        a driving transistor that supplies electric power to the predetermined load; and
        a current sensing transistor formed in a smaller size than the driving transistor and having the control input terminal and the second terminal in common with the driving transistor, and
    wherein the current detection circuit measures both-end voltage of a resistance element joined to the first terminal of the current sensing transistor.

9. The device according to claim 8, wherein the driver device further includes a control logic circuit that performs a predetermined protective operation through the driver when the junction temperature obtained by the temperature calculation circuit exceeds a first temperature determination value, and wherein the control device performs a predetermined protective operation through the driver device when the junction temperature obtained by the temperature estimation unit exceeds a second temperature determination value.

10. The device according to claim 9, wherein the first temperature determination value is higher than the second temperature determination value.

11. A semiconductor device which drives a power transistor including a control input terminal, a first terminal, and a second terminal, for supplying electric power to a predetermined load through the first terminal and the second terminal, comprising:

a driver that drives the control input terminal;

a voltage detection circuit that detects an inter-terminal voltage of the first terminal and the second terminal during an on-period of the power transistor;

a current detection circuit that detects an inter-terminal current of the first terminal and the second terminal during the on-period of the power transistor; and an overheat detection circuit that detects presence or absence of overheat in the power transistor, wherein the overheat detection circuit includes a temperature calculation circuit that calculates an on-resistance of the power transistor, based on the inter-terminal voltage detected by the voltage detection circuit and the inter-terminal current detected by the current detection circuit, to estimate a junction temperature, wherein the power transistor includes:

a driving transistor that supplies electric power to the predetermined load; and a current sensing transistor formed in a smaller size than the driving transistor and having the control input terminal and the second terminal in common with the driving transistor, and wherein the current detection circuit measures both-end voltage of a resistance element joined to the first terminal of the current sensing transistor.

12. The device according to claim 11, wherein the overheat detection circuit detects presence or absence of overheat, by comparison between the on-resistance calculated by the temperature calculation circuit and a predetermined resistance determination value.

13. The device according to claim 12, wherein the overheat detection circuit further includes a determination value correction circuit that corrects the predetermined resistance determination value according to a size of the inter-terminal current.

14. The device according to claim 11, further comprising a control logic circuit that controls the power transistor to be turned off through the driver when the overheat detection circuit detects the presence of the overheat.

15. The device according to claim 11, further comprising an over-current detection circuit that determines presence or absence of over-current in the power transistor, by comparison between the inter-terminal current detected by the current detection circuit and a predetermined current determination value.

16. The device according to claim 11, further comprising a DESAT detection circuit that determines saturation or non-saturation in the power transistor, by comparison between the inter-terminal voltage detected by the voltage detection circuit and a predetermined voltage determination value.

* * * * *